(12) United States Patent
Takamura et al.

(10) Patent No.: US 9,124,289 B2
(45) Date of Patent: Sep. 1, 2015

(54) PREDICTED PIXEL VALUE GENERATION PROCEDURE AUTOMATIC PRODUCING METHOD, IMAGE ENCODING METHOD, IMAGE DECODING METHOD, APPARATUS THEREFOR, PROGRAMS THEREFOR, AND STORAGE MEDIA WHICH STORE THE PROGRAMS

(75) Inventors: Seishi Takamura, Yokosuka (JP); Masaaki Matsumura, Yokosuka (JP); Yoshiyuki Yashima, Yokosuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 990 days.

(21) Appl. No.: 13/125,120

(22) PCT Filed: Oct. 21, 2009

(86) PCT No.: PCT/JP2009/005522
§ 371 (c)(1),
(2), (4) Date: Apr. 20, 2011

(87) PCT Pub. No.: WO2010/050152
PCT Pub. Date: May 6, 2010

(65) Prior Publication Data
US 2011/0200105 A1    Aug. 18, 2011

(30) Foreign Application Priority Data

Oct. 27, 2008  (JP) ................................. 2008-275811

(51) Int. Cl.
*H04N 19/00*  (2014.01)
*H03M 7/30*  (2006.01)
(Continued)

(52) U.S. Cl.
CPC ............... *H03M 7/30* (2013.01); *H04N 19/146* (2014.11); *H04N 19/182* (2014.11); *H04N 19/50* (2014.11); *H04N 19/90* (2014.11)

(58) Field of Classification Search
None
See application file for complete search history.

(56) References Cited

U.S. PATENT DOCUMENTS 5,926,226 A * 7/1999 Proctor et al. ........... 375/240.22
5,974,186 A * 10/1999 Smith et al. .................... 382/240
(Continued)

FOREIGN PATENT DOCUMENTS

| CN | 1391413 A | 1/2003 |
|----|-----------|--------|
| CN | 1564604 A | 1/2005 |

(Continued)

OTHER PUBLICATIONS

Sakanashi, H., et al., "Evolvable hardware for lossless compression of very high resolution bi-level images," IEE Proceedings: Computers and Digital Techniques, vol. 151, No. 4, Jul. 2004, pp. 277-286.
(Continued)

*Primary Examiner* — Jay Patel
*Assistant Examiner* — Reza Aghevli
(74) *Attorney, Agent, or Firm* — Harness, Dickey & Pierce, P.L.C.

(57) ABSTRACT

An automatic producing method for a predicted value generation procedure that predicts a value of an encoding target pixel by using a previously-decoded pixel. A parent population is generated by randomly producing predicted value generation procedures each of which is indicated by a tree structure, and a plurality of predicted value generation procedures are selected as parents from the parent population. One or more predicted value generation procedures are generated as children based on a predetermined tree structure developing method which subjects the selected predicted value generation procedures to a development where an existing predicted value generation function can be an end node of a tree. A predicted value generation procedure having a best estimation cost is selected from among the predicted value generation procedures as the parents and children, where the sum of an information content for representing the tree structure and an amount of code evaluated by a predicted pixel value obtained by the tree structure is used as an estimation cost. A final predicted value generation procedure is produced by iterating the relevant operation.

15 Claims, 13 Drawing Sheets

(51) Int. Cl.
　　　*H04N 19/50*　　　(2014.01)
　　　*H04N 19/146*　　(2014.01)
　　　*H04N 19/182*　　(2014.01)
　　　*H04N 19/90*　　　(2014.01)

(56) References Cited

U.S. PATENT DOCUMENTS

| | | | |
|---|---|---|---|
| 6,696,993 | B2 | 2/2004 | Karczewicz |
| 7,003,035 | B2 * | 2/2006 | Tourapis et al. ......... 375/240.12 |
| 7,428,341 | B2 | 9/2008 | Suzuki et al. |
| 7,885,988 | B2 * | 2/2011 | Bashyam et al. ............. 707/812 |
| 8,594,192 | B2 * | 11/2013 | Kondo et al. ............ 375/240.12 |
| 2004/0170335 | A1 | 9/2004 | Pearlman et al. |
| 2005/0131660 | A1 | 6/2005 | Yadegar et al. |
| 2005/0281337 | A1 | 12/2005 | Kobayashi et al. |
| 2007/0053432 | A1 | 3/2007 | Kondo et al. |
| 2007/0223582 | A1 * | 9/2007 | Borer ....................... 375/240.12 |
| 2008/0025396 | A1 | 1/2008 | Tasaka et al. |
| 2008/0117977 | A1 | 5/2008 | Lee et al. |
| 2008/0137746 | A1 | 6/2008 | Tsai et al. |
| 2008/0154928 | A1 * | 6/2008 | Bashyam et al. ............. 707/101 |
| 2010/0094782 | A1 | 4/2010 | Kobayashi |

FOREIGN PATENT DOCUMENTS

| | | |
|---|---|---|
| CN | 101091204 A | 12/2007 |
| JP | 11-4415 A | 1/1999 |
| JP | 11-243491 A | 9/1999 |
| JP | 2002-204358 A | 7/2002 |
| KR | 10-0743849 B1 | 8/2007 |
| KR | 10-2008-0064982 A | 7/2008 |
| KR | 10-2008-0089166 A | 10/2008 |
| RU | 2335860 C2 | 10/2008 |
| RU | 2336663 C1 | 10/2008 |
| RU | 2341035 C1 | 12/2008 |

OTHER PUBLICATIONS

Notice of Allowance, Japanese Patent Application No. 2010-535643, Jan. 7, 2014.
Examination Report from the Intellectual Property Office, Taiwanese Patent Application No. 098135883, Dec. 27, 2013.
Fukunaga, Alex, et al., "Evolving Nonlinear Predictive Models for Lossless Image Compression with Genetic Programming," Proceedings of the Third Annual Conference on Genetic Programming, 1998, pp. 95-102.
Richardson, Iain, "Video coding: H264 and MPEG-4 next generation standards," Moscow: Technosphera, 2005, translation of 2003 edition, pp. 87-97.
Takagi, Kohichi, et al., "Motion picture coding based on region segmentation using genetic algorithm," Systems and Computers in Japan, vol. 33, May 2002, pp. 41-50 (abstract).
Decision on Grant, Russian Patent Application No. 2011115425, Apr. 1, 2013.
Office Action, Canadian Patent Application No. 2,740,800, Jun. 21, 2013.
Notice of Allowance of Patent, Korean Patent Application No. 10-2011-7008939, Jul. 1, 2013.
Higuchi, Tetsuya, et al., "Evolvable Hardware at Function Level," IEEE International Conference on Evolutionary Computation, Indianapolis, IN, Apr. 13-16, 1997, pp. 187-192.
Kamp, Steffen, et al., "Decoder Side Motion Vector Derivation for Inter Frame Video Coding," 15th IEEE International Conference on Image Processing, Oct. 12, 2008, pp. 1120-1123.
Salami, M., et al., "On-Line Compression of High Precision Printer Images by Evolvable Hardware," Proceedings of Data Compression Conference, Snowbird, UT, Mar. 30-Apr. 1, 1998, pp. 219-228.
Johnson, J. Michael, et al., "Genetic Algorithms in Engineering Electromagnetics," IEEE Antennas and Propagation Magazine, vol. 39, No. 4, Aug. 1997, pp. 7-25.
Decision on Grant, Russian Patent Application No. 2012114800, Mar. 25, 2013.
First Office Action, Chinese Patent Application No. 200980141664.7, Apr. 15, 2013.
Search Report, European Patent Application No. 09823266.3, Apr. 25, 2013.
Kashirina, L.I., "Introduction into Evolutionary Modeling," Voronezh, Russia: Voronezh State University, 2007, pp. 3-7 and 32-35.
ISO/IEC SC29/WG1, ISO/IEC 10918-1 "Digital compression and coding of continuous-tone still images", p. 133, 1993.
M. Weinberger, G. Seroussi, and G. Sapiro, "The LOCO-I Lossless Image Compression Algorithm: Principles and Standardization into JPEG-LS", IEEE Trans. Image Processing, vol. 9, No. 8, pp. 1309-1324, Aug. 2000.
Ichiro Matsuda, Nau Ozaki, Yuji Umezu, and Susumu Itoh, "Lossless Coding Using Variable Block-Size Adaptive Prediction Optimized for Each Image", Proceedings of 13th European Signal Processing Conference (EUSIPCO 2005), WedAmPO3, Sep. 2005.
Koh'ichi Takagi, Atsushi Koike, Shuichi Matsumoto, and Hideo Yamamoto, "Moving Picture Coding Based on Region Segmentation Using Genetic Algorithm", Proceedings of IEICE, D-II, vol. J83-D-II, No. 6, pp. 1437-1445, Jun. 2000 with English abstract thereof.
J. Koza, "Genetic Programming II, Automatic Discovery of Reusable Programs", The MIT Press, p. 41, 1998.
X. Wu and N. Memon, "Context-Based, Adaptive, Lossless Image Coding", IEEE Transactions on Communications, vol. 45, No. 4, pp. 437-444, Apr. 1997.
Hiroshi Sato, Isao Ono, and Shigenobu Kobayashi, "A New Generation Alternation Model for Genetic Algorithms and Its Assessment", Journal of Japanese Society for Artificial Intelligence, vol. 12, No. 5, pp. 734-744, 1996 including English summary in front page.
Masaharu Tanaka, Hidenori Sakanashi, Masanobu Mizoguchi and Tetsuya Higuchi, "Bi-level Image Coding for Digital Printing Using Genetic Algorithm", Proceedings of IEICE, D-II, vol. J83-D-II, No. 5, pp. 1274-1283, May 2000.
Wataru Fujishima and Tomoharu Nagao, "PT-ACTIT; Parameter Tunable-Automatic Construction of Tree-structural Image Transformation", Journal of Institute of Image Information and Television Engineers, vol. 59, No. 11, pp. 1687-1693, 2005 including English abstract in front page.
International Search Report issued on the related PCT (PCT/JP2009/005522) with English translation thereof.

* cited by examiner

FIG. 13

| IMAGE | Lena | | Baboon | | Airplane | | Peppers | | Average | |
|---|---|---|---|---|---|---|---|---|---|---|
| PREDICTOR | X+Y [bpp] | INCREMENT FROM PROPOSED METHOD | X+Y [bpp] | INCREMENT FROM PROPOSED METHOD | X+Y [bpp] | INCREMENT FROM PROPOSED METHOD | X+Y [bpp] | INCREMENT FROM PROPOSED METHOD | X+Y [bpp] | INCREMENT FROM PROPOSED METHOD |
| LS | 4.551 | 1.472% | 5.521 | 0.989% | 3.654 | 3.673% | 4.465 | 2.502% | 4.548 | 2.011% |
| LE | 4.529 | 0.969% | 5.506 | 0.704% | 3.619 | 2.678% | 4.417 | 1.394% | 4.517 | 1.329% |
| GAP | 4.539 | 1.208% | 5.556 | 1.627% | 3.568 | 1.241% | 4.468 | 2.579% | 4.533 | 1.678% |
| MED | 4.692 | 4.609% | 5.592 | 2.278% | 3.644 | 3.393% | 4.646 | 6.665% | 4.643 | 4.156% |
| PROPOSED METHOD | 4.485 | (0%) | 5.467 | (0%) | 3.525 | (0%) | 4.356 | (0%) | 4.458 | (0%) |
| X (PROPOSED METHOD) | 818[bits] | | 523[bits] | | 656[bits] | | 905[bits] | | 726[bits] | |

FIG. 14

| Inw | In | Ine |
|-----|----|----|
| Iw  | p  |     |

PREDICTED PIXEL VALUE GENERATION PROCEDURE AUTOMATIC PRODUCING METHOD, IMAGE ENCODING METHOD, IMAGE DECODING METHOD, APPARATUS THEREFOR, PROGRAMS THEREFOR, AND STORAGE MEDIA WHICH STORE THE PROGRAMS

CROSS-REFERENCE TO RELATED APPLICATIONS

This application is a 371 U.S. National Stage of International Application No. PCT/JP2009/005522, filed Oct. 21, 2009. This application claims priority to Japanese Patent Application No. 2008-275811, filed Oct. 27, 2008. The disclosures of the above applications are incorporated herein by reference.

TECHNICAL FIELD

The present invention relates to a method and corresponding apparatus for automatically producing a predictor (procedure that generates a predicted pixel value) for use in image encoding, the predictor generating a value of an encoding target pixel by using a previously-decoded pixel. The invention further relates to image encoding/decoding methods and corresponding apparatuses that use the automatically produced predictor to achieve highly accurate pixel value prediction and efficient decoding therefrom. The invention further relates to computer-readable storage media storing computer-executable programs for implementing the above-described methods.

BACKGROUND ART

In mainstream image encoding, each pixel value of the encoding target is predicted using previously-decoded former or upper pixels to obtain a prediction residual which is then encoded.

In such a prediction encoding method, when encoding a target pixel to be encoded (called "p"), a predicted value for p is generated using the fact that previously-decoded peripheral pixels (e.g., Inw, In, Ine, and Iw in FIG. 14) have generally high correlation with p. Thus such peripheral pixels are actually used. In the equations below, the predicted value for p is called p'. In the step that follows, a prediction error p-p' is subjected to entropy encoding.

For example, Lossless Mode in JPEG (see Non-Patent Document 1) has seven types of predictors, and one selected from among them is used for predicting and encoding a pixel value.

In an example called an "average prediction" as one of the methods in the JPEG predictors, prediction is performed by computing an average between In and Iw as follows:

$$x'=(In+Iw)/2 \quad \text{Formula (1)}$$

There are also six other prediction methods (in addition to the above) which include:

$$x'=In+Iw-Inw \text{ plane prediction} \quad \text{Formula (2)}$$

$$x'=In \text{ previous value prediction} \quad \text{Formula (3)}$$

$$x'=Inw+(In-Iw)/2 \text{ complex prediction} \quad \text{Formula (4)}$$

JPEG-LS (see Non-Patent Document 2) having a higher level of efficiency than JPEG employs a slightly more complicated prediction method called "MED prediction" as shown below.

if Inw max (Iw, In) then
  x'=min (Iw, In)
else if Inw min (Iw, In) then
  x'=max (Iw, In)
else
  x'=Iw+In−Inw where max (x, y) is a function that returns one of x and y, whichever is larger, and min (x, y) is a function that returns one of x and y, whichever is smaller.

In addition, a method which defines a weighted average between peripheral pixels to be a predicted value is generally known. In a simplified method, the weight of each peripheral pixel may be computed by means of a least-square method for each image, or coefficient optimization for minimizing the relevant amount of code may be performed (see Non-Patent Document 3).

Additionally, although it does not belong to prediction encoding, Non-Patent Document 4 discloses encoding parameter optimization for image or video encoding, which employs a genetic algorithm (GA), where a "template" for generating a context which is used for encoding a binary image is modified using a genetic algorithm, thereby improving efficiency. That is, the template is treated as a parameter, and a fixed encoding procedure is used.

As a similar method relating directionality, Non-Patent Document 5 discloses using a genetic algorithm for dynamically changing a divided shape of a unit area to be encoded, thereby improving the relevant efficiency. Similar to the template in Non-Patent Document 4, the encoding procedure is fixed also in this case.

PRIOR ART DOCUMENT

Non-Patent Document

Non-Patent Document 1: ISO/IEC SC29/WG1, ISO/IEC 10918-1 "Digital compression and coding of continuous-tone still images", p. 133, 1993

Non-Patent Document 2: M. Weinberger, G. Seroussi, and G. Sapiro, "The LOCO-I Lossless Image Compression Algorithm: Principles and Standardization into JPEG-LS", IEEE Trans. Image Processing, Vol. 9, No. 8, pp. 1309-1324, August 2000

Non-Patent Document 3: Ichiro Matsuda, Nau Ozaki, Yuji Umezu, and Susumu Itoh, "Lossless Coding Using Variable Block-Size Adaptive Prediction Optimized for Each Image", Proceedings of 13th European Signal Processing Conference (EUSIPCO 2005), WedAmPO3, September 2005

Non-Patent Document 4: Masaharu Tanaka, Hidenori Sakanashi, Masanobu Mizoguchi and Tetsuya Higuchi, "Bi-level Image Coding for Digital Printing Using Genetic Algorithm", Proceedings of IEICE, D-II, Vol. J83-D-II, No. 5, pp. 1274-1283, May 2000

Non-Patent Document 5: Koh'ichi Takagi, Atsushi Koike, Shuichi Matsumoto, and Hideo Yamamoto, "Moving Picture Coding Based on Region Segmentation Using Genetic Algorithm", Proceedings of IEICE, D-II, Vol. J83-D-II, No. 6, pp. 1437-1445, June 2000

DISCLOSURE OF INVENTION

Problem to be Solved by the Invention

As described above, conventional prediction methods have only the flexibility to optimize numeral parameters such as weights for each image. Importantly, in such conventional prediction methods, the "prediction procedure" for determining a pixel used for prediction computation, or the formula used for conditional branching, is fixed.

That is, conventionally, if a new prediction procedure is desired, it must be manually generated through human trial-and-error. Therefore, the structure of the corresponding predictor cannot have a complexity whose level exceeds the complexity understandable by humans.

Furthermore, there is no conventional method for newly producing a dedicated prediction procedure for each input image.

Additionally, in image processing, a target image to be processed (i.e., teacher information or resource) should be manually generated and provided by a human.

In light of the above circumstances, an object of the present invention is to provide a novel technique which contributes to highly efficient encoding and decoding, by implementing automatic computer production of a prediction procedure which is appropriately applied to an input image and can further reduce the relevant amount of code. Here, similar to the conventional prediction methods, the present invention also uses previously-decoded peripheral pixels to generate a predicted value. However, unlike conventional techniques where the prediction procedure is manually generated by human trial-and-error, the prediction procedure itself is automatically produced using genetic programming techniques based on a genetic algorithm as described above.

Means for Solving the Problem

<1> Structure of Predictor (Predicted Pixel Value Generation Procedure) Automatic Producing Apparatus of Present Invention First, the structure of a predicted pixel value generation procedure automatic producing apparatus in accordance with the present invention will be explained. To aid readability, the term "predictor" shall be used to refer to the predicted pixel value generation procedure. As will be explained, the present invention uses a genetic programming technique to automatically produce a predictor. In conventional techniques the predictor is manually generated by human selection or by human trial-and-error. Thus in the following description the automatic procedure to generate a predictor needs to be distinguished from the function or use of the predictor (procedure for generating predicted pixel values).

An apparatus for automatically producing a predictor in accordance with the present invention implements automatic production of a predictor that predicts a value of an encoding target pixel by using a previously-decoded pixel. The apparatus has a structure implementing genetic programming techniques which includes the following components which perform genetic programming (through parent-child generation and selection techniques) to automatically produce a predictor:

(1) a first device that generates a parent population by randomly producing predictors, each of which is represented by a tree structure—the predictor itself is a procedure or algorithm, which algorithm is represented within the computer by a tree structure;

(2) a second device that selects a plurality of predictors as parents from the parent population, and produces one or more predictors as children based on a predetermined tree structure developing (or evolving) method which subjects the selected predictors to a development (or evolution) where an existing predicted value generation function can be an end node of a tree;

(3) a third device that:
    selects a predictor having a minimum estimation cost from among the predictors as the parents and children, where the sum of an information content for representing the tree structure and an amount of code evaluated by a predicted pixel value obtained by the tree structure is used as an estimation cost, and the selected predictor has the best estimation cost for encoding an encoding target image; and
    stores the selected predictor and one or more other predictors into the parent population; and (4) a fourth device that performs a control so as to iterate processes performed by the second and third devices until a predetermined condition is satisfied, and produces a predictor having a best estimation cost as the result of the iteration to be a final predictor.

In the above structure, the second device may produce the predictors as the children based on the predetermined tree structure developing method which performs the development where a function which outputs coordinates of a pixel within an image can be an end node of a tree. For an understanding of how to use a tree structure to represent an algorithm, reference may be had to FIG. 1. As described above, Formula (1) is utilized to calculate "average prediction," where peripheral previously-decoded pixels are shown in FIG. 14. This Formula (1) can be represented using the tree structure shown in FIG. 1, allowing the computer to store a structured representation of the formula (algorithm).

In addition, the first device may generate the parent population so that an existing predicted value generation function is included in the parent population.

A method of automatically producing a predictor according to the present invention realized by the operations of the processing devices described above can also be realized by a computer program. The computer program is stored in an appropriate, computer-readable recording medium or supplied via a network, and, when implementing the invention, the program is installed and operated in a control device such as a CPU, whereby the invention is realized.

In the apparatus for automatically producing predictors having the above-described structure, when a parent population is generated by randomly producing predictors, each of which is indicated by a tree structure, a plurality of predictors are selected as parents from the parent population. Then one or more predictors are produced as children based on a predetermined tree structure developing method which subjects the selected predictors to a development process. Then a predictor having a minimum estimation cost is selected, where the sum of an information content (which may be obtained by Algorithm 1 described later) for representing the tree structure and an amount of code evaluated by a predicted pixel value (which may be obtained by Algorithm 2 described later) obtained by the tree structure is used as an estimation cost, and the selected predictor has the best estimation cost for encoding an encoding target image. The selected predictor and some other predictors are stored into the parent population. A new predictor is automatically produced by iterating the above processes.

Accordingly, the apparatus for automatically producing predictors of the present invention implements highly accurate pixel value prediction by automatically producing a predictor based on a tree structure developing method such as genetic programming. Since the sum of an information content for representing the tree structure and an amount of code evaluated by a predicted pixel value obtained by the tree structure is used as an estimation cost, it is possible to automatically produce a predictor for implementing highly efficient image encoding, while preventing enlargement of a tree.

In addition, since the tree structure developing method is executed under a condition that an existing predicted value generation function can be an end node of a tree, it is possible to obtain a level of prediction efficiency equal to that of the conventional method.

In order to further reliably obtain such an effect, when generating a parent population, the parent population may be generated so that an existing predicted value generation function is included in the parent population.

In addition, the tree structure developing method may be executed under a condition that a function which outputs coordinates of a pixel within an image can be an end node of a tree. Accordingly, local switching for the predictor may be possible by using the x and y coordinates in accordance with the internal structure of a relevant image.

<2> Structure of Image Encoding Apparatus and Image Decoding Apparatus of Present Invention (First Type)

When implementing a function of transmitting an automatically produced predictor to the decoding side, the image encoding apparatus and the image decoding apparatus in accordance with the present invention have the following structures.

<2-1> Structure of Image Encoding Apparatus of Present Invention

When implementing a function of transmitting a predictor to the decoding side, an image encoding apparatus in accordance with the present invention has a structure which includes:

(1) a first device that produces a predictor having a best estimation cost for encoding an encoding target image, by means of an operation executed by an apparatus for automatically producing a predictor in accordance with the present invention;

(2) a second device that encodes the predictor produced by the first device (by using, for example, Algorithm 3 described later);

(3) a third device that generates a predicted value of each pixel included in the encoding target image based on the predictor produced by the first device (i.e., by using, for example, Algorithm 2 described later); and (4) a fourth device that encodes a prediction residual signal computed based on the predicted pixel value generated by the third device.

An image encoding method of the present invention realized by the operations of the processing devices described above can also be realized by a computer program. The computer program is stored in an appropriate computer-readable recording medium or supplied via a network, and, when implementing the invention, the program is installed and operated in a control device such as a CPU, whereby the invention is realized.

In accordance with the above structure, the image encoding apparatus of the present invention implements highly accurate pixel value prediction based on the production by the apparatus for automatically producing a predictor in accordance with the present invention, and performs image encoding by using a predictor for implementing highly efficient image encoding. Therefore, it is possible to implement such highly efficient image encoding.

<2-2> Structure of Image Decoding Apparatus of Present Invention

In order to decode encoded data generated by the image encoding apparatus of the present invention described in the above item <2-1>, an image decoding apparatus in accordance with the present invention has a structure which includes:

(1) a first device that decodes encoded data for a predictor produced by an operation executed by an apparatus for automatically producing a predictor in accordance with the present invention (by using, for example, Algorithm 4 described later), where the encoded data was generated on an encoding side;

(2) a second device that generates a predicted value of each pixel included in a decoding target image based on the predictor decoded by the first device (i.e., by using, for example, Algorithm 2 described later); and (3) a third device that decodes encoded data for a prediction residual signal computed using the predicted pixel value which was generated based on the predictor decoded by the first device, where the encoded data was generated on an encoding side; and (4) a fourth device that reproduces the decoding target image based on the predicted pixel value generated by the second device and the prediction residual signal decoded by the third device.

An image decoding method of the present invention realized by the operations of the processing devices described above can also be realized by a computer program. The computer program is stored in an appropriate computer-readable recording medium or supplied via a network, and, when implementing the invention, the program is installed and operated in a control device such as a CPU, whereby the invention is realized.

In accordance with the above structure, the image decoding apparatus of the present invention implements decoding of encoded data generated by the image encoding apparatus of the present invention described in the above item <2-1>.

<3> Structure of Image Encoding Apparatus and Image Decoding Apparatus of Present Invention (Second Type)

For each image encoded on the encoding side, a decoded image therefor is also generated on the decoding side, so that the same decoded image can be commonly possessed on the encoding and decoding sides. Therefore, transmission of a predictor from the encoding side to the decoding side, which is required for implementing one embodiment of the present invention, may be omitted in an alternate embodiment.

In order to implement such alternate embodiment, the image encoding apparatus and the image decoding apparatus in accordance with the present invention have the following structures.

<3-1> Structure of Image Encoding Apparatus of Present Invention

When implementing a function not to transmit a predictor to the decoding side, an image encoding apparatus in accordance with the present invention has a structure which includes:

(1) a first device that encodes a partial encoding target image having a predetermined size, by using an existing predictor produced not based on a tree structure developing method;

(2) a second device that produces a predictor having a best estimation cost for encoding a decoded image obtained during the encoding of the partial encoding target image by the first device, by means of an operation executed by an apparatus for automatically producing a predictor in accordance with the present invention, which estimates an information content for representing a tree structure to be zero;

(3) a third device that generates a predicted value of each pixel included in the remaining partial encoding target image which was not encoded by the first device, based on the predictor produced by the second device (i.e., by using, for example, Algorithm 2 described later); and (4) a fourth device that encodes a prediction residual signal computed based on the predicted pixel value generated by the third device.

An image encoding method of the present invention realized by the operations of the processing devices described above can also be realized by a computer program. The computer program is stored in an appropriate computer-readable recording medium or supplied via a network, and, when implementing the invention, the program is installed and operated in a control device such as a CPU, whereby the invention is realized.

In accordance with the above structure, the image encoding apparatus of the present invention implements highly accurate pixel value prediction based on the production by the apparatus for automatically producing a predictor according to the present invention, and performs image encoding by using a predictor for implementing highly efficient image encoding. Therefore, it is possible to implement such highly efficient image encoding.

In addition, the above image encoding apparatus of the present invention encodes a partial encoding target image having a predetermined size by using an existing predictor produced independent of a tree structure developing method, thereby generating a decoded image for the relevant partial encoding target image, where the decoded image can be commonly possessed on the encoding and decoding sides. The decoded image is used for producing a predictor which can also be produced on the decoding side and has a best estimation cost. Therefore, it is possible to omit the transmission of the predictor to the decoding side.

<3-2> Structure of Image Decoding Apparatus of Present Invention

In order to decode encoded data generated by the image encoding apparatus of the present invention described in the above item <3-1>, an image decoding apparatus in accordance with the present invention has a structure which includes:

(1) a first device that decodes encoded data for a partial decoding target image which has a predetermined size and was encoded using an existing predictor produced not based on a tree structure developing method, where the encoded data was generated on an encoding side;

(2) a second device that produces a predictor having a best estimation cost for encoding the partial decoding target image obtained by the first device, by means of an operation executed by an apparatus for automatically producing a predictor in accordance with the present invention, which estimates the information content for representing a tree structure to be zero;

(3) a third device that generates a predicted value of each pixel included in the remaining partial decoding target image which was not decoded by the first device, based on the predictor produced by the second device (i.e., by using, for example, Algorithm 2 described later);

(4) a fourth device that decodes encoded data for a prediction residual signal computed using the predicted pixel value which was generated based on the predictor decoded by the second device, where the encoded data was generated on an encoding side; and (5) a fifth device that reproduces the remaining partial decoding target image which was not decoded by the first device, based on the predicted pixel value generated by the third device and the prediction residual signal decoded by the fourth device.

An image decoding method of the present invention realized by the operations of the processing devices described above can also be realized by a computer program. The computer program is stored in an appropriate computer-readable recording medium or supplied via a network, and, when implementing the invention, the program is installed and operated in a control device such as a CPU, whereby the invention is realized.

In accordance with the above structure, the image decoding apparatus of the present invention implements decoding of encoded data generated by the image encoding apparatus of the present invention described in the above item <3-1>.

In addition, the above image decoding apparatus of the present invention decodes encoded data of a partial decoding target image which has a predetermined size and was encoded using an existing predictor produced independent of a tree structure developing method, thereby generating a decoded image for the relevant partial decoding target image, where the decoded image can be commonly possessed on the encoding and decoding sides. The decoded image is used for producing a predictor which can also be produced on the encoding side and has a best estimation cost. Therefore, it is possible to omit the transmission of the predictor from the encoding side.

Effect of the Invention

As described above, in accordance with the present invention, (i) a pixel value predicting procedure itself is automatically changed using a computer while evaluating the information content for the predictor, or (ii) a development computation is also performed on the decoding side by using pixels which were previously encoded using an existing method. Therefore, it is possible to use a predictor which can reduce the information content for the residual, and thus to encode an image with a less amount of code.

In addition, since candidates for an end node (in the present invention) also include a predictor function based on the conventional methods, a level of prediction efficiency can be achieved that is greater than or equal to (at lowest) that obtainable by the conventional methods. Furthermore, the candidates may include the coordinates of each pixel to be encoded, so that the prediction procedure can be switched in accordance with the internal structure of the relevant image.

Additionally, since, of course, the input image cannot be fixed, it is anticipated that an evolutionary image processing method (see Reference Document 4 described later) by Nagao et al., can be generally applied to various input images. However, it is actually impossible to ensure that the relevant method can be preferably applied to each unknown input image. In contrast, the present invention concentrates on efficient encoding of the current input image, thus it is unnecessary to consider such unknown input. Therefore, the present invention has a high level of practicality.

In addition, since the sum of the information content for the residual and the information content for the tree is only a parameter to be minimized in the present invention, it is unnecessary to use "teacher information" or training information which would need to be prepared by humans in general image processing applications.

BRIEF DESCRIPTION OF THE DRAWINGS

FIG. 13 is a diagram explaining an experiment performed so as to verify effectiveness of the present invention.

Figure 14:
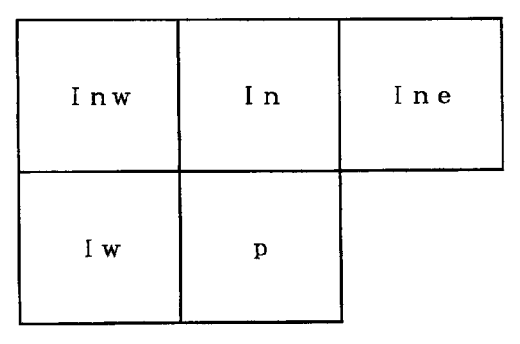

FIG. 14 is a diagram explaining previously-decoded pixels which surrounds a target pixel.

MODE FOR CARRYING OUT THE INVENTION

The present invention uses a genetic programming (GP) to implement an automatic computer production of a prediction procedure (predictor), which is then appropriately applied to an input video or static image (simply called an "image" below). In so doing, this can further reduce the relevant amount of code.

Below, the basic concept of the present invention will be shown.

<1> Tree Structure Representation of Prediction Procedure

Figure 1:
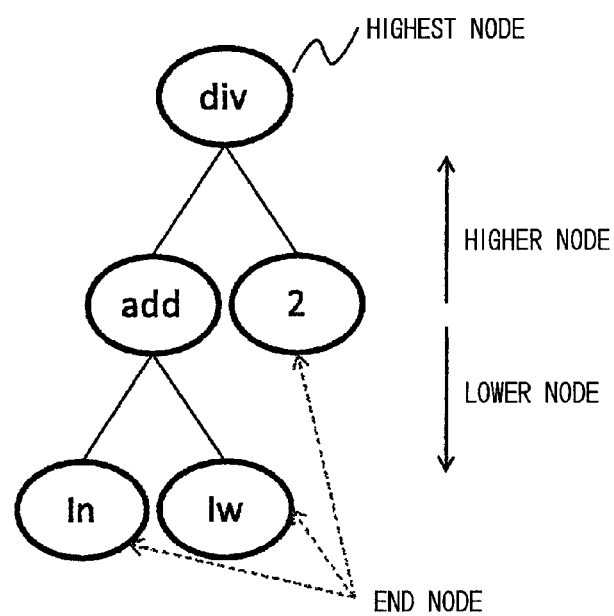
FIG. 1 is a schematic diagram showing a tree structure representation for average prediction.

As stated above, the predictor is a procedure or algorithm that can be represented within a computer memory using a tree structure (a form of "symbolic expression"). By way of illustration, the average prediction indicated by the above-described Formula (1) can be represented using a tree structure as shown in FIG. 1. For convenience, the terms "symbolic expression" and "tree-structure" may be used interchangeably.

In the genetic programming explained later, the symbolic expression is customarily used for representing a tree structure.

For example, using such symbolic expression, the above-described max (x, y) is represented symbolically as (max x y), and the above-described MED prediction procedure from Non-Patent Document 2 would be symbolically expressed as follows: (T (sub (Inw) (max (Iw) (In))) (min (Iw) (In)) (T (sub (min (Iw) (In)) (Inw)) (max (Iw) (In)) (add (Iw) (sub (In) (Inw))))).

In the above symbolic expression, the specific placement or occurrence of line feeds or line breaks have no specific meaning. Thus the above symbolic expression could equivalently be presented as:
(T (sub (Inw) (max (Iw) (In)))
(min (Iw) (In))
(T (sub (min (Iw) (In)) (Inw))
(max (Iw) (In))
(add (Iw) (sub (In) (Inw))))), this later presentation being supplied with additional line feeds to aid in comparison with the MED prediction procedure described above in connection with Non-Patent Document 2.

Generally, it can be seen that the above function T has three arguments, and the following condition branching is represented:

$$(T\ A\ B\ C) = B \text{ if } A \geq 0 \qquad \text{Formula (5)}$$
$$= C \text{ if } A < 0$$

where T is the first letter of "ternary".

It will be understood that the above example of function T is presented merely for teaching purposes. As described above, any algorithm can be represented as a "tree", and thus a pixel value prediction algorithm (i.e., a predictor) can be represented as a tree similarly. As illustrated in FIG. 1, a tree structure has a highest node and at least one end node, and may also have intermediate nodes (such as the "higher node" and "lower node" illustrated). As will be more fully explained below, the techniques for automatically generating predictors rely on knowledge of where symbolically expressed functions and their arguments are placed into the tree structure. In the above example, the function T occurs first in the symbolic expression and thus appears at the highest node.

Instead of the above "T", the relevant function may use addition, subtraction, multiplication, division, trigonometric function, square, square root, exponent, logarithm, absolute value, minimum value, maximum value, or the like.

Since such a function uses arguments, the function will appear at a position other than at the end node of the relevant tree, and thus the function is often called a "non-end node". The function may be prepared in advance, or it may be dynamically defined (see Reference Document 1).

Reference Document 1: J. Koza, "Genetic Programming II, Automatic Discovery of Reusable Programs", The MIT Press, pp. 41, 1998

In addition, a numerical value such as 0.148 or a peripheral pixel value such as Iw, In, Ine, or Inw (see FIG. 14) may function as an end node, which itself has a value and is assigned to an end node of a tree.

<2> Characteristics of End Nodes in Present Invention

In the present invention, candidates for end nodes may include a function which outputs a predicted value by using an existing encoding method.

Since any function needs arguments, the above function is originally not assigned to any end node. However, the function which outputs a predicted value by using an existing encoding method is a function based on the existing encoding method, and thus the types of arguments for the function are predetermined. Therefore, the function can also be assigned to an end node.

Similar to the above-described peripheral pixel value, the predicted value output from the function "which outputs a predicted value by using an existing encoding method" is individually determined for each (target) pixel to be encoded.

The predicted value output from the relevant function may be a least-square predicted value, plane predicted value, predicted value for CALIC (see Reference Document 2 below), predicted value for JPEG-LS, or the like.

Reference Document 2: X. Wu and N. Memon: "Context-Based, Adaptive, Lossless Image Coding", IEEE Transactions on Communications, Vol. 45, No. 4, pp. 437-444, April 1997

As described above, when the candidates for end nodes include a function which outputs a predicted value by using an existing encoding method, it is possible to obtain a level of prediction efficiency equal to that of the conventional method, substantially without any overhead.

That is, in the present invention, as explained later, the prediction procedure (i.e., tree structure) for pixel value prediction is developed (or evolved) using a genetic programming, so as to automatically produce a predictor (i.e., prediction procedure) having improved prediction efficiency, where candidates for end nodes include a function which outputs a predicted value by using an existing encoding method. Accordingly, a conventional predictor can also be a target for the relevant development. As more fully explained in Reference Document 1, the genetic programming technique generally involves creating an initial population and evaluating the fitness of each individual in the population. If a termination criterion is not satisfied by this "initial generation" population, members of the initial "parent" population are modified by mutation, or by reproduction to produce "children," which are then added to a new population that is also evaluated for fitness. The procedure iteratively repeats until the termination criterion is met. In essence, the genetic programming technique automatically generates children from the prior generation parents thereby allowing many different mutations and variants of the original population, along with the original population to be tested and the optimal one selected. In this case, the initial population is a set of predictors. The children produced via the genetic programming technique are additional predictors. The optimal candidate (predictor) is the one that provides the highest prediction efficiency, for example.

Therefore, if a conventional predictor can provide a higher level of prediction efficiency than another automatically-produced predictor, such a conventional predictor is finally automatically produced by the genetic programming, thereby obtaining prediction efficiency equal to that of the conventional method, substantially without any overhead.

If a combination between a predictor developed (or evolved) using the genetic programming and a conventional predictor can implement further efficient prediction, it is employed for the encoding.

Additionally, in the present invention, the candidates for end nodes also include a function which outputs coordinates of a (target) node to be encoded.

The coordinates output from such a function may have normalized values such as "x=−1" for each left-end pixel; "x=1" for each right-end pixel, "y=−1" for each upper-end pixel; "y=1" for each lower-end pixel in an image, or real coordinate values.

The function which outputs coordinates of a target node may randomly output the coordinates within the image plane, without using arguments. Therefore, the function can also be assigned to an end node.

As described above, when the candidates for end nodes also include a function which outputs coordinates (within the image plane) of a target node to be encoded, local switching for processing is possible by using the x and y coordinates, in accordance with the internal structure of the relevant image.

For example, it is possible to produce a predictor which performs processing switching in accordance with the value of y in a manner such that the upper ⅚ part of an image is applied to a predictor employing a prediction procedure, and the remaining lower ⅙ part is applied to a predictor employing another prediction procedure.

<3> Estimated Value for Prediction Procedure, Information Content (Amount of Information) of Tree, and Computation Method for Predicted Value <3-1> Estimated Value for Prediction Procedure When developing (or evolving) the prediction procedure as explained later, an estimated scale is necessary.

In the present invention, the sum (X+Y) of the followings is used as estimated values (called "goodness of fit" in genetic programming) for each individual which represents a prediction procedure:

(i) information content X (amount of information) for representing a tree structure; and (ii) information content Y of a prediction residual obtained by actual pixel value prediction using a prediction procedure based on the above tree structure.

In the present invention, the estimated value for an individual (tree is denoted as "individual" in genetic programming) is determined not only based on the information content Y of the prediction residual, but also in consideration of the information content X of the tree. One reason thereof is that it is necessary to transmit the prediction procedure itself to the decoder side.

Another reason is that when the estimated value is determined in consideration of the information content X of tree, it is possible to prevent a "bloat" problem (enlargement of a tree) in the genetic programming.

<3-2> Information Content X for Representing Tree Structure

The Information content X for representing a tree structure is the sum of the information contents of all nodes included in the tree.

The Information content for representing a tree structure may be computed by the following recursive function. Here, it is assumed that the numerical value associated with each node in the tree alignment is represented, for example, by a 10-bit fixed-point integer.

---
Algorithm 1
---
```
function tree_info(t)
begin
    if t is a numerical value then
        return FUNCINFO + 10
    else begin
        s: = FUNCINFO // function part
        foreach (about all lower nodes c connected t) begin
            s: = s + tree_info(c)
        end
        return s
    end
end
```
---

Here, it is assumed that serial numbers 0 to N−1 are assigned to individual functions.

FUNCINFO is the following value which indicates the amount of code generated when a function is subjected to fixed-length encoding:

$$FUNCINFO = \log_2(N+1) \qquad \text{Formula (6)}$$

where (N+1) is employed so as to also consider a numerical value (e.g., 2 or ¼) other than functions.

Although fixed-length encoding is assumed above, variable-length encoding or arithmetic encoding in consideration of occurrence frequency for each function may be performed.

After that, given with "root" as the highest node in a target prediction procedure (tree), the information content X of the tree can be computed by:

$$X = tree\_info(root) \qquad \text{Formula (7)}$$

<3-3> Computation Method for Predicted Value

The method of computing a predicted value based on the prediction procedure represented by the relevant tree may use a recursive function as shown below.

---
Algorithm 2
---
```
function tree_eval(t)
begin
    if t is a numerical value then// immediate value
        return the numerical value
    else if t has no argument then // e.g.,: In
        return function value of t
    else if t has one argument then // e.g.,: sqrt(A)
        return function of t (tree_eval (first lower node of t))
    else if t has two arguments then // e.g.,: add (A, B)
        return function of t (tree_eval (first lower node of t), tree_eval
            (second lower node of t))
    else if t has three arguments then // e.g.,: ternary operator T
        return function of t (tree_eval (first lower node of t), tree_eval
            (second lower node of t), tree_eval (third lower node of t))
end
```
---

Although the above algorithm limitedly assumes the number of arguments to be three or less, similar processes can be performed even if the upper limit of the arguments is set to be 4, 5, . . . .

After that, given with "root" as the highest node in a target prediction procedure (tree), a predicted value p' for the current target pixel can be computed using:

$x'=\text{tree\_eval}(root)$      Formula (8)

The information content Y of the prediction residual may be computed by the following formula.

[Formula 1]

$$Y = -\sum_{h_d \neq 0} h_d \log_2 \frac{h_d}{W \times H}$$      Formula (1)

In the above formula, $h_d$ indicates the number of occurrence (for histogram) of prediction error d (=x−x') in the whole image, and W and H respectively indicates the numbers of pixels in the horizontal and vertical directions.

Similarly, as executed in CALIC, the information content may be reduced using a method called "context isolation", "error feedback", or "error flipping".

<4> Encoding and Decoding of Prediction Procedure
<4-1> Encoding of Prediction Procedure The encoding of a prediction procedure can also be executed using the following recursive procedure similar to the information content evaluation.

---
Algorithm 3
---
```
procedure tree_encode(t)
    begin
        if t is a numerical value then begin
            encode N (numerical value) using FUNCINFO bits
            encode (fixed-point) numerical value using 10-bit form
        end else begin
            encode function number (0, .. N−1) of t by using FUNCINFO
                bits
            foreach (about all lower nodes c connected t) begin
                tree_encode(c)
            end
        end
end
```
---

After that, given with "root" as the highest node in a target prediction procedure (tree), "tree_encode (root)" can be executed, thereby encoding the relevant tree, where the lower limit of the required amount of code coincides with "tree_info (root)".

<4-2> Decoding of Prediction Procedure

The decoding of the prediction procedure encoded by Algorithm 3 can also be executed using a similar recursive procedure shown below.

---
Algorithm 4
---
```
function tree_decode( )
begin
    generate empty tree T
    decode FUNCINFO bits to decode function number n
    if n = N then begin // numerical value
        decode 10 bits to decode 10-bit fixed-point value x
        T: = x
    end else begin
        compute function F corresponding to function number n
        T: = F
        for i = 1 to "number of arguments required by F" begin
            i-th lower node of T: = tree_decode( )
        end
    end
    return T
end
```
---

The above number of arguments required by F is the number (known by both the encoder and decoder sides) of values used for outputting a value from the relevant function. If F=add, the relevant number is 2, and if F=T, the relevant number is 3.

Here, F has lower nodes corresponding to the relevant number, as arguments of its own.

After that, when executing tree_decode( ), the tree is decoded by means of the relevant bit stream, and is then returned.

<5> Automatic Development of Prediction Procedure Using Genetic Programming

In the present invention, the predictor is developed by the following generally-known procedure (including replica selection, child generation, and survival selection) for the genetic programming.

In the genetic programming, each tree is called an "individual". The following explanation is based thereon.

1. First, a population is generated in advance by using random numbers or an existing prediction algorithm (e.g., the above-described plane or MED prediction).

2. From among the population, a set of parents (parent population) is selected (replica selection).

3. A set of child individuals is generated from the parent population (child generation), and is estimated (the estimation scale was explained above).

4. Based on results of the estimation, survivals from the set of child individuals are selected (survival selection).

Figure 2:
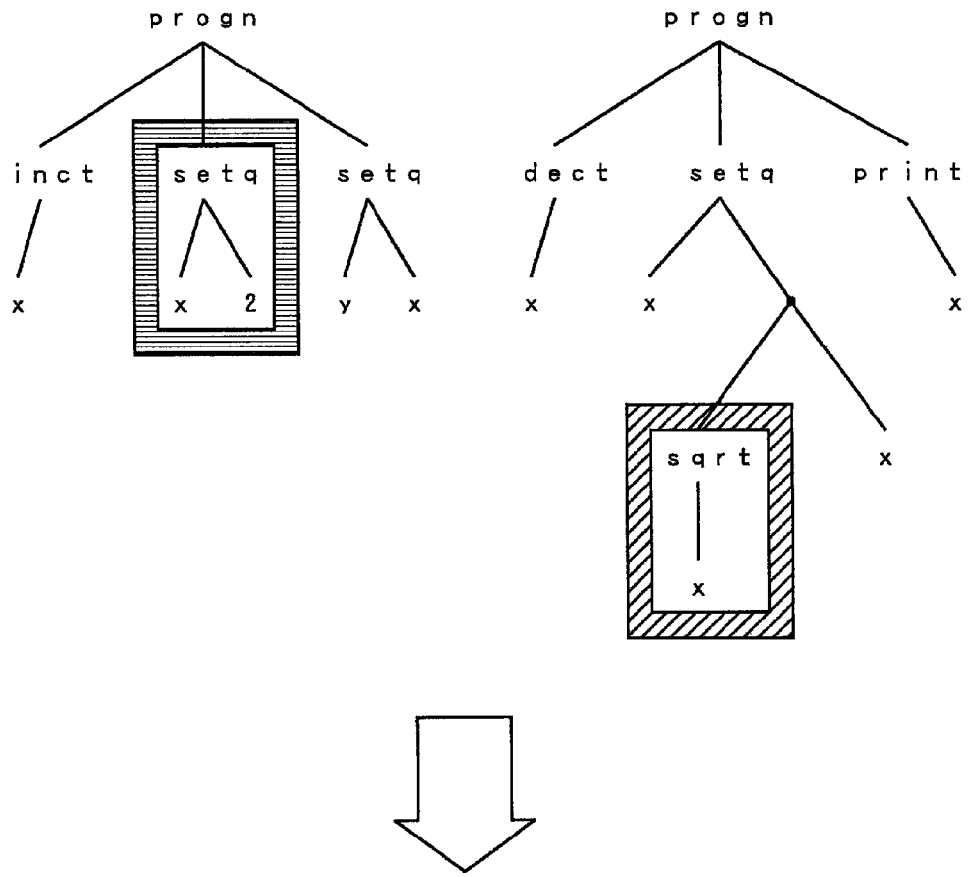
FIG. 2 is a schematic diagram explaining a crossover operation.
Figure 2:
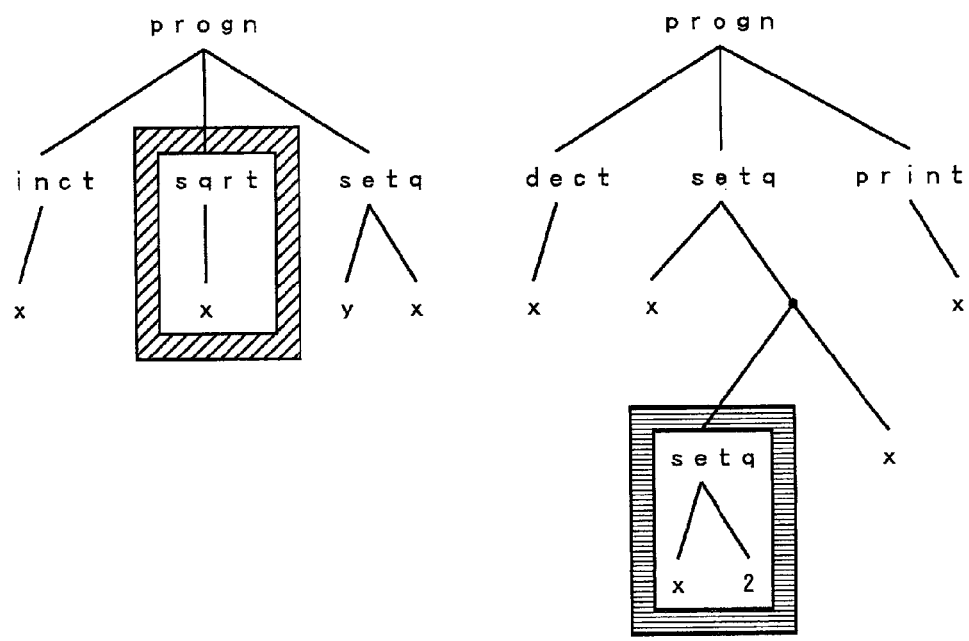
Figure 3:
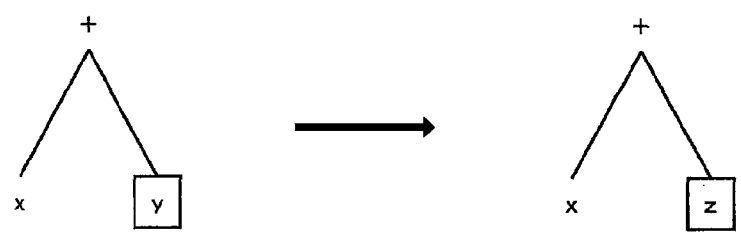
FIG. 3 is a schematic diagram explaining a mutation operation.
Figure 4:
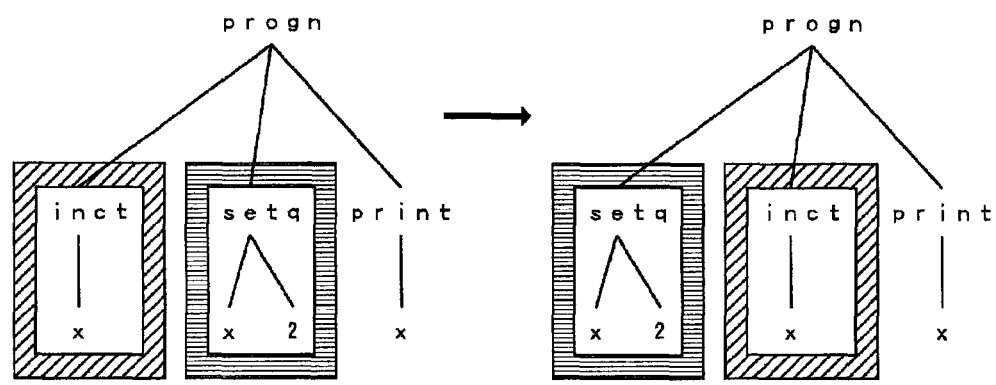
FIG. 4 is a schematic diagram explaining an inversion operation.

In the above procedure, each "child" is generated by performing the following process between individuals selected as parents:

(i) crossover as shown in FIG. 2, for randomly selecting crossover points in parents 1 and 2, and performing crossover between partial trees in accordance with the crossover points;

(ii) mutation as shown in FIG. 3, for randomly selecting a mutation point, and replacing a partial tree with a mutation tree in accordance with the mutation point; or (iii) inversion as shown in FIG. 4, for performing exchange between brother trees.

The replica selection and survival selection are collectively called a "generation alternation model", for which a generally-known MGG (minimal generation gap) method proposed by the following Reference Document 3 may be applied.

Reference Document 3: Hiroshi Sato, Isao Ono, and Shigenobu Kobayashi, "A New Generation Alternation Model for Genetic Algorithms and Its Assessment", Journal of Japanese Society for Artificial Intelligence, Vol. 12, No. 5, pp. 734-744, 1996

The following Reference Document 4 discloses a representative method for developing an operation procedure by using a genetic programming, where the method relates to a procedure for image processing.

Reference Document 4: Wataru Fujishima and Tomoharu Nagao, "PT-ACTIT; Parameter Tunable-Automatic Construction of Tree-structural Image Transformation", Journal of Institute of Image Information and Television Engineers, Vol. 59, No. 11, pp. 1687-1693, 2005

However, no method for developing an "image" encoding procedure (as provided by the present invention) has been proposed. The above-described methods disclosed by Non-Patent Document 4 or 5 is nothing but optimization of an encoding parameter.

Below, the present invention will be explained in detail by using embodiments.

Figure 5:
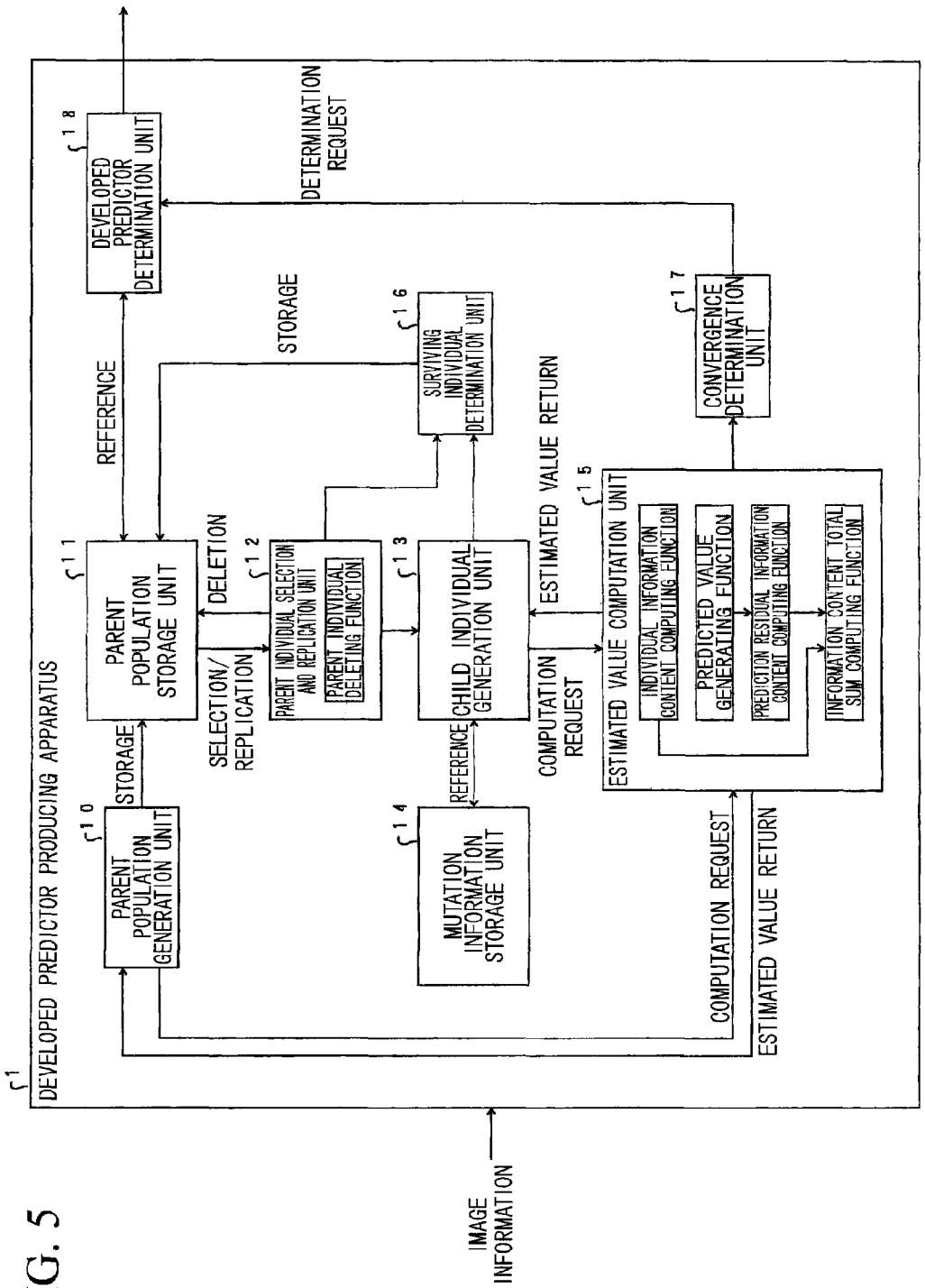
FIG. 5 is a diagram showing the structure of a developed predictor producing apparatus as an embodiment of the present invention.

FIG. 5 shows the structure of a developed predictor producing apparatus 1 as an embodiment of the present invention.

The developed predictor producing apparatus 1 in the present embodiment implements automatic production of a predictor which uses a genetic programming (in which each tree is called an individual) to generate a predicted pixel value. Below, a predictor produced in the present embodiment is called a developed predictor.

In order to implement the automatic production, as shown in FIG. 5, the apparatus includes a parent population generation unit 10, a parent population storage unit 11, a parent individual selection and replication unit 12, a child individual generation unit 13, a mutation information storage unit 14, an estimated value computation unit 15, a surviving individual determination unit 16, a convergence determination unit 17, and a developed predictor determination unit 18.

The parent population generation unit 10 generates a parent population by randomly generating individuals for a predictor as a origin for a developed predictor, and stored the parent population into the parent population storage unit 11. In this process, an existing predicted value generation function (as an individual) is contained in the generated and stored parent population.

The parent population generation unit 10 also requests the estimated value computation unit 15 to compute an estimated value for each individual stored in the parent population storage unit 11, and receives the estimated value returned from the estimated value computation unit 15 in response to the relevant request. The parent population generation unit 10 stores each estimated value into the parent population storage unit 11, in association with the corresponding individual (also stored).

The parent individual selection and replication unit 12 selects and replicates a plurality of individuals stored in the parent population storage unit 11, thereby generating a plurality of parent individuals.

The parent individual selection and replication unit 12 also deletes the individuals as origins for the generated parent individuals from the parent population storage unit 11.

Based on the genetic programming, the child individual generation unit 13 generates child individuals by subjecting the parent individuals generated by the parent individual selection and replication unit 12 to crossover as shown in FIG. 2; mutation as shown in FIG. 3 by using mutation information stored in the mutation information storage unit 14; inversion as shown in FIG. 4; or the like.

The child individual generation unit 13 also computes an estimated value for each generated child individual by requesting the estimated value computation unit 15 to compute the estimated value, and receiving the estimated value returned from the estimated value computation unit 15 in response to the relevant request.

The mutation information storage unit 14 stores mutation information (i.e., mutated tree) used when the child individual generation unit 13 subjects a parent individual to mutation, and the mutation information includes a function (as an individual) which outputs relevant coordinates in an image and an existing predicted value generation function (also as an individual).

When the estimated value computation unit 15 receives a request for computing an estimated value for a designated individual, it computes a total sum of information content (the above-described X: individual information content) required for representing the corresponding tree structure, and information content (the above-described Y: prediction residual information content) of a prediction residual of the whole image for which pixel value prediction was actually performed using a prediction procedure based on the relevant tree structure. The estimated value computation unit 15 returns the computed total sum of information content as an estimated value for the individual, to the unit which issued the estimated value computation request.

Based on the estimated value (retrieved from the parent population storage unit 11) for each parent individual generated by the parent individual selection and replication unit 12 and the estimated value assigned to each child individual generated by the child individual generation unit 13, the surviving individual determination unit 16 selects an individual having the best estimated value, and stores the selected individual and other one or more individuals into the parent population storage unit 11, together with the corresponding estimated values.

Based on the estimated values output from the estimated value computation unit 15 and the like, the convergence determination unit 17 determines whether or not a convergence condition, which indicates completion of the developed predictor production, has been satisfied. If it is determined that the condition has been satisfied, the convergence determination unit 17 directs the developed predictor determination unit 18 to determine the developed predictor.

When receiving the developed predictor determination request from the convergence determination unit 17, the developed predictor determination unit 18 specifies an individual having the best estimated value from among the individuals stored in the parent population storage unit 11, and determines and outputs the specified individual to be a developed predictor.

Figure 6:
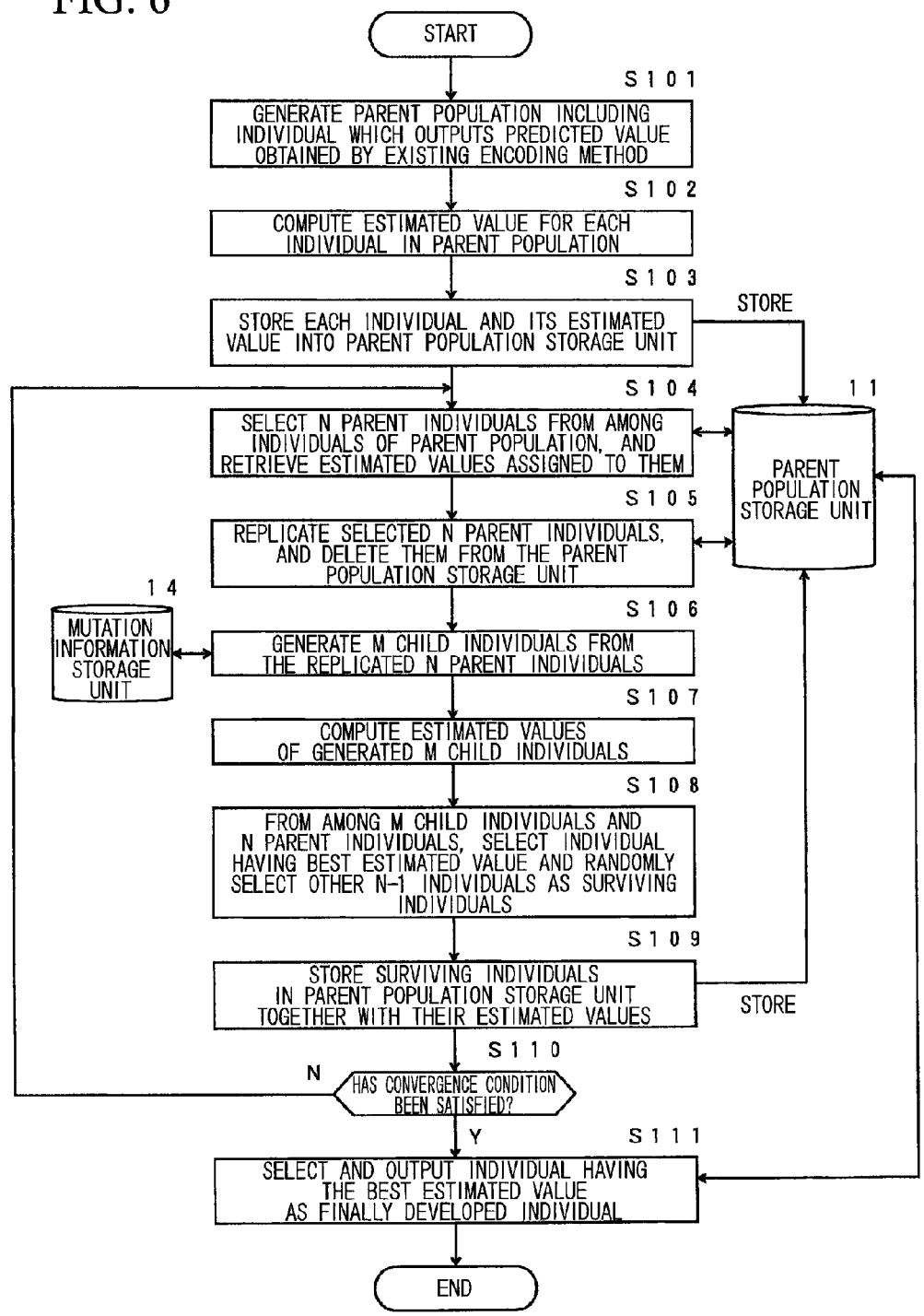
FIG. 6 is a flowchart executed by the developed predictor producing apparatus in the embodiment.

FIG. 6 is a flowchart executed by the developed predictor producing apparatus 1 having the above-described structure.

In accordance with the flowchart, the operation executed by the developed predictor producing apparatus 1 will be explained in detail.

As shown in the flowchart of FIG. 6, when receiving a request for generating a developed predictor for an image as an encoding target, the developed predictor producing apparatus 1 first generates a parent population (i.e., a set of individuals as an origin for the relevant development) including an individual which outputs a predicted value by using an existing encoding method (see step S101).

In the next step S102, for each individual in the parent population, the sum of information content X for representing a corresponding tree and information content Y for a prediction residual of the whole image for which pixel value prediction was actually performed using a prediction procedure based on the relevant tree structure is computed so as to compute an estimated value.

The information content X for representing a corresponding tree is computed using the above-described algorithm 1.

The predicted value obtained by the prediction procedure based on the tree structure is computed using the above-described algorithm 2.

In the next step S103, each individual in the parent population is stored in the parent population storage unit 11 together with the estimated value assigned to the individual.

In the next step S104, N parent individuals are selected from among the individuals stored in the parent population storage unit 11, and the estimated values assigned to them are also retrieved.

In the next step S105, the selected N individuals are replicated, and also deleted from the parent population storage unit 11.

In the next step S106, M child individuals are generated from the N replicated parent individuals by performing, for example, crossover as shown in FIG. 2, mutation as shown in FIG. 3, or inversion as shown in FIG. 4 by means of genetic programming which may use the mutation information stored in the mutation information storage unit 14.

In the above process, candidates for an individual (tree) added by mutation include a function for generating a predicted value by using a conventional method, and a function which outputs x and y coordinates of a pixel to be encoded.

In the next step S107, for each of the generated M child individuals, the sum of information content X for representing a corresponding tree structure and information content Y for a prediction residual of actual pixel value prediction using a prediction procedure based on the relevant tree structure is computed so as to compute an estimated value.

In the next step S108, from among selection targets consisting of the generated M child individuals and the replicated N parent individuals, an individual having the best estimated value is selected and other N−1 individuals are randomly selected, as surviving individuals.

In the next step S109, the selected surviving individuals are stored into the parent population storage unit 11 together with the corresponding estimated values assigned to them.

In the next step S110, it is determined whether or not a predetermined convergence condition has been satisfied. If it is determined that the convergence condition has not yet been satisfied, then it is determined that the development is currently insufficient, and the operation returns to step S104. The employed convergence condition may be such that a decreasing rate of estimated value Z (X+Y) becomes less than a fixed value (e.g., 0.1%), or that the number of iterations for estimated value computation exceeds a fixed value (e.g., 10,000).

If it is determined in the above step S110 that the predetermined convergence condition has been satisfied, then the operation proceeds to step S111, where the individual having the best estimated value is selected and output as a finally developed individual (i.e., developed predictor), from among the individuals of the parent population stored in the parent population storage unit 11. The operation is then completed.

As described above, the developed predictor producing apparatus 1 of the present embodiment can automatically produce a developed predictor which implements highly accurate pixel value prediction, by using genetic programming.

In order to implement such automatic production, the developed predictor producing apparatus 1 of the present embodiment uses an estimated value which is the sum of information content X for representing a tree structure and information content Y for a prediction residual of the whole image for which pixel value prediction was actually performed using a prediction procedure based on the relevant tree structure. Therefore, it is possible to automatically produce a predictor which performs pixel value prediction for implementing highly efficient image encoding.

For the above operation, candidates for an added individual include a function which generates a predicted value by using a conventional method. Therefore, a level of prediction efficiency equal to the conventional method can be obtained.

In addition, when such an individual as a function which generates a predicted value by using a conventional method is included in a parent population when generating the parent population, the above "equal level of prediction efficiency" can be more reliably realized.

Furthermore, since the candidates for an added individual include a function which output x and y coordinates of a pixel to be encoded, it is also possible to perform a local change in the developed predictor in accordance with the internal structure of the relevant image by using the x and y coordinates.

Figure 7:
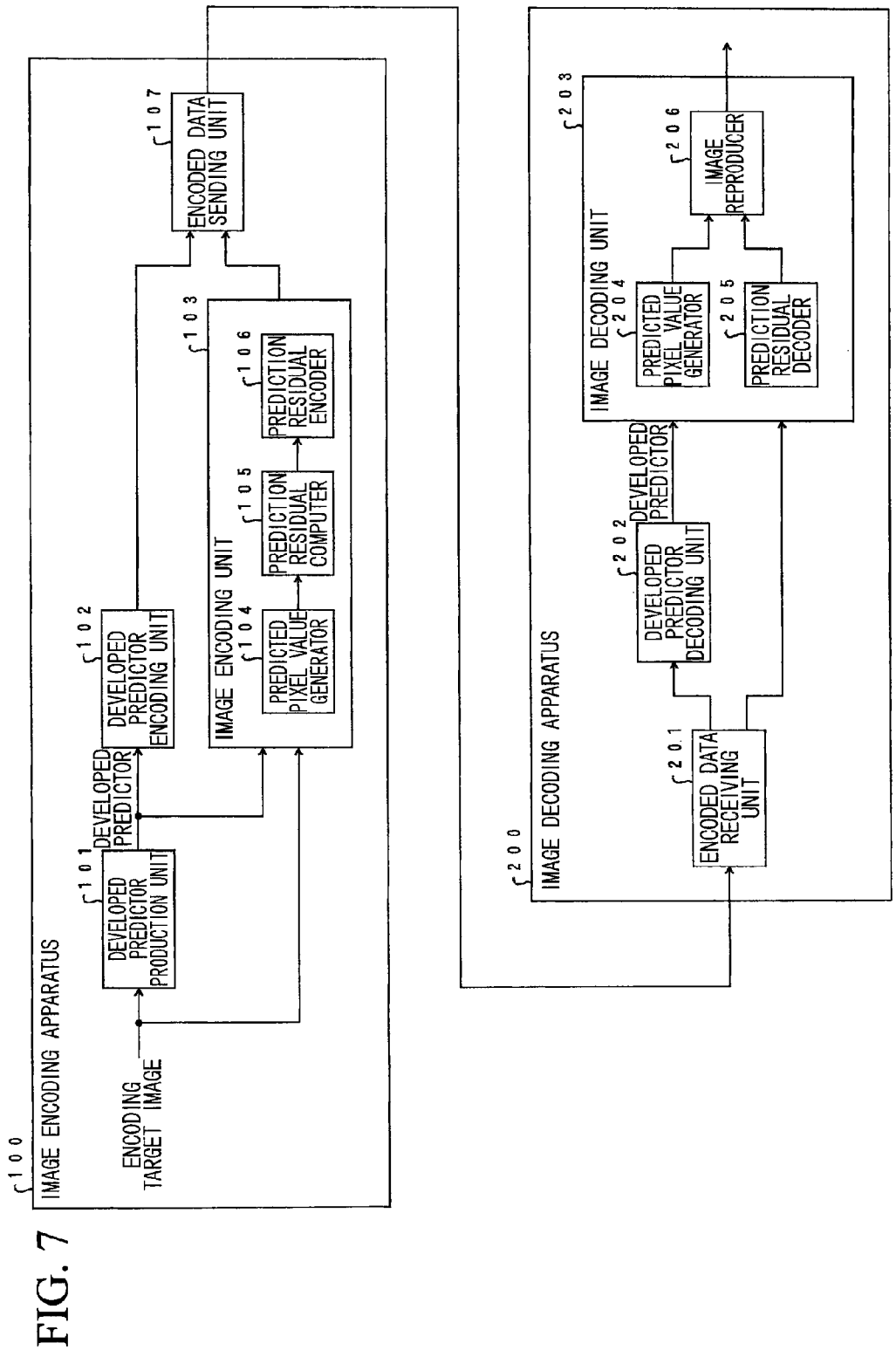
FIG. 7 is a diagram showing the structures of an image encoding apparatus and an image decoding apparatus as an embodiment of the present invention.

FIG. 7 shows embodiments of an image encoding apparatus 100 and an image decoding apparatus 200 which use the developed predictor producing apparatus 1 of the present embodiment.

The image encoding apparatus 100 in FIG. 7 includes a developed predictor production unit 101 which produces a developed predictor applied to an encoding target image in accordance with the operation executed by the developed predictor producing apparatus 1 of the above embodiment, a developed predictor encoding unit 102 for encoding the developed predictor produced by the developed predictor production unit 101, an image encoding unit 103 for encoding an encoding target image by using the developed predictor produced by the developed predictor production unit 101, and an encoded data sending unit 107 which sends the image decoding apparatus 200 (in the present embodiment) encoded data generated by the developed predictor encoding unit 102 and the image encoding unit 103.

The above image encoding unit 103 includes a predicted pixel value generator 104 which predicts a pixel value by using the developed predictor produced by the developed predictor production unit 101, a prediction residual computer 105 which computes a prediction residual based on the pixel value predicted by the predicted pixel value generator 104, and a prediction residual encoder 106 for encoding the prediction residual computed by the prediction residual computer 105.

The image decoding apparatus 200 in FIG. 7 includes an encoded data receiving unit 201 for receiving the encoded data sent from the image encoding apparatus 100 of the present embodiment, a developed predictor decoding unit 202 for decoding the developed predictor produced by the image encoding apparatus 100 by decoding the encoded data of the developed predictor received by the encoded data receiving unit 201, and an image decoding unit 203 for decoding the image encoded by the image encoding apparatus 100 based on the developed predictor decoded by the developed predictor decoding unit 202 and the encoded data received by the encoded data receiving unit 201.

In order to decode the image encoded by the image encoding apparatus 100, the image decoding unit 203 includes an predicted pixel value generator 204 for predicting a predicted value by using the developed predictor decoded by the developed predictor decoding unit 202, a prediction residual decoder 205 for decoding the encoded data of the prediction residual received by the encoded data receiving unit 201, and an image reproducer 206 for reproducing the image encoded by the image encoding apparatus 100 based on the pixel value predicted by the predicted pixel value generator 204 and the prediction residual decoded by the prediction residual decoder 205.

Figure 8:
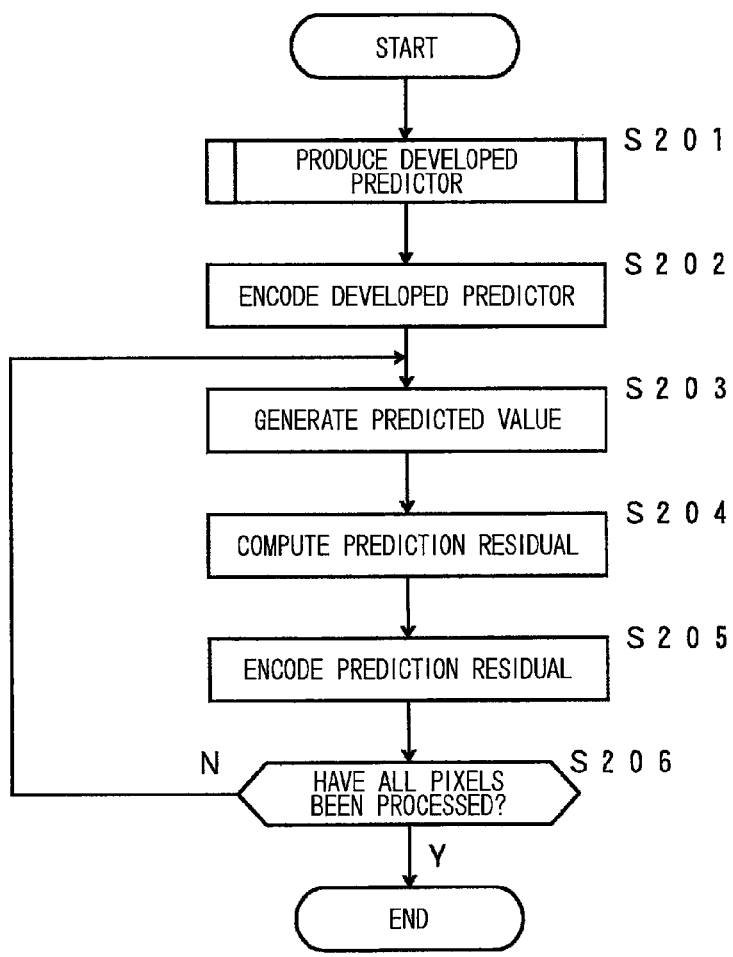
FIG. 8 is a flowchart executed by the image encoding apparatus in the embodiment.
Figure 9:
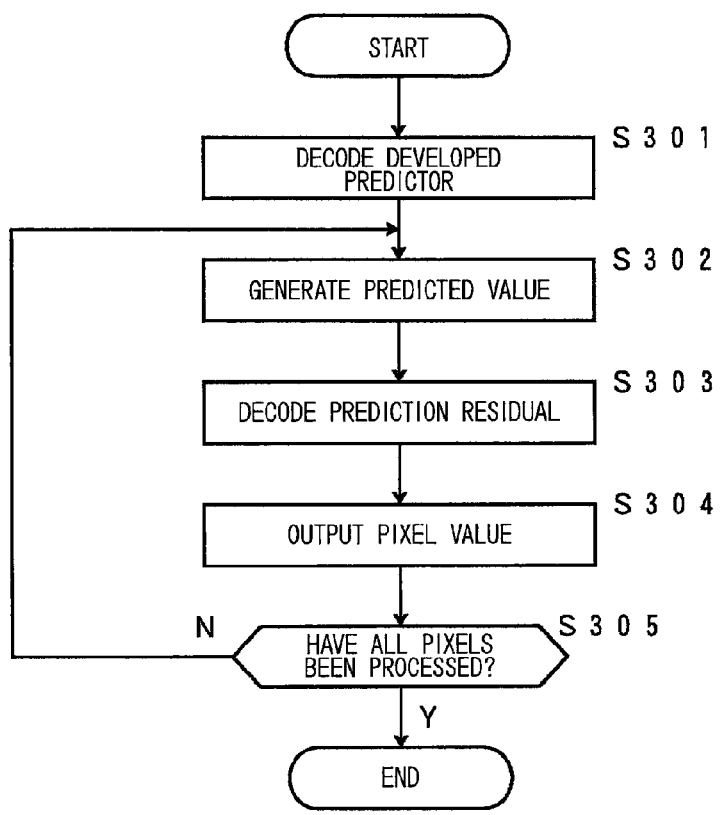
FIG. 9 is a flowchart executed by the image decoding apparatus in the embodiment.

FIG. 8 is a flowchart executed by the image encoding apparatus 100 shown in FIG. 7, and FIG. 9 is a flowchart executed by the image decoding apparatus 200 shown in FIG. 7.

In accordance with the flowcharts, operations performed by the image encoding apparatus 100 and the image decoding apparatus 200 having the structures shown in FIG. 7 will be explained.

As shown in the flowchart of FIG. 8, when the image encoding apparatus 100 having the structure in FIG. 7 receives a request for encoding an encoding target image, it first produces a developed predictor applied to the encoding target image based on the operation executed by the above-described developed predictor producing apparatus 1 (see step S201). In the next step S202, the produced developed predictor is encoded using the above-described algorithm 3.

Next, for the encoding of the encoding target image, a predicted pixel value (the above-described p') is generated using the produced developed predictor (see step S203), and a prediction residual (the above-described p−p') is then computed based on the generated predicted pixel value (see step S204).

In the next step S205, the computed prediction residual is encoded, and in the following step S206, it is determined whether or not the encoding has been completed for all pixels contained in the encoding target image. If it is determined that the encoding of all pixels has not yet been completed, the operation returns to step S203. If it is determined that the encoding of all pixels has been completed, the current operation is terminated.

As shown in the flowchart of FIG. 9, when the image decoding apparatus 200 having the structure shown in FIG. 7 receives the encoded data generated by the image encoding apparatus 100, the image decoding apparatus 200 first decodes the encoded data of the developed predictor based on the above-described algorithm 4, so as to decode the developed predictor produced by the image encoding apparatus 100 (see step S301).

In the following decoding of a decoding target image, in step S302, a predicted pixel value (the above-described p') is generated using the decoded developed predictor, and in the next step S303, encoded data of the prediction residual is decoded so as to obtain a decoded prediction residual (i.e., the above-described p−p'). In the next step S304, a pixel value is generated and output based on the above-generated predicted pixel value and the decoded prediction residual.

In the next step S305, it is determined whether or not the relevant decoding has been completed for all pixels included in the decoding target image. If it is determined that the decoding of all pixels has not yet been completed, the operation returns to step S302. If it is determined that the decoding of all pixels has been completed, the current operation is terminated.

As described above, the image encoding apparatus 100 having the structure shown in FIG. 7 produces a developed predictor, encodes an image by using the developed predictor, and also encodes the developed predictor. The image decoding apparatus 200 having the structure shown in FIG. 7 obtains the developed predictor produced by the image encoding apparatus 100, by decoding encoded data of the developed predictor, and decodes the relevant image by using the developed predictor.

Also as described above, the developed predictor producing apparatus 1 automatically produces a developed predictor which implements highly accurate pixel value prediction.

Therefore, in accordance with the image encoding apparatus 100 and the image decoding apparatus 200 which encode and decode an image by using a developed predictor produced by the developed predictor producing apparatus 1, a high level of encoding efficiency can be acquired.

Figure 10:
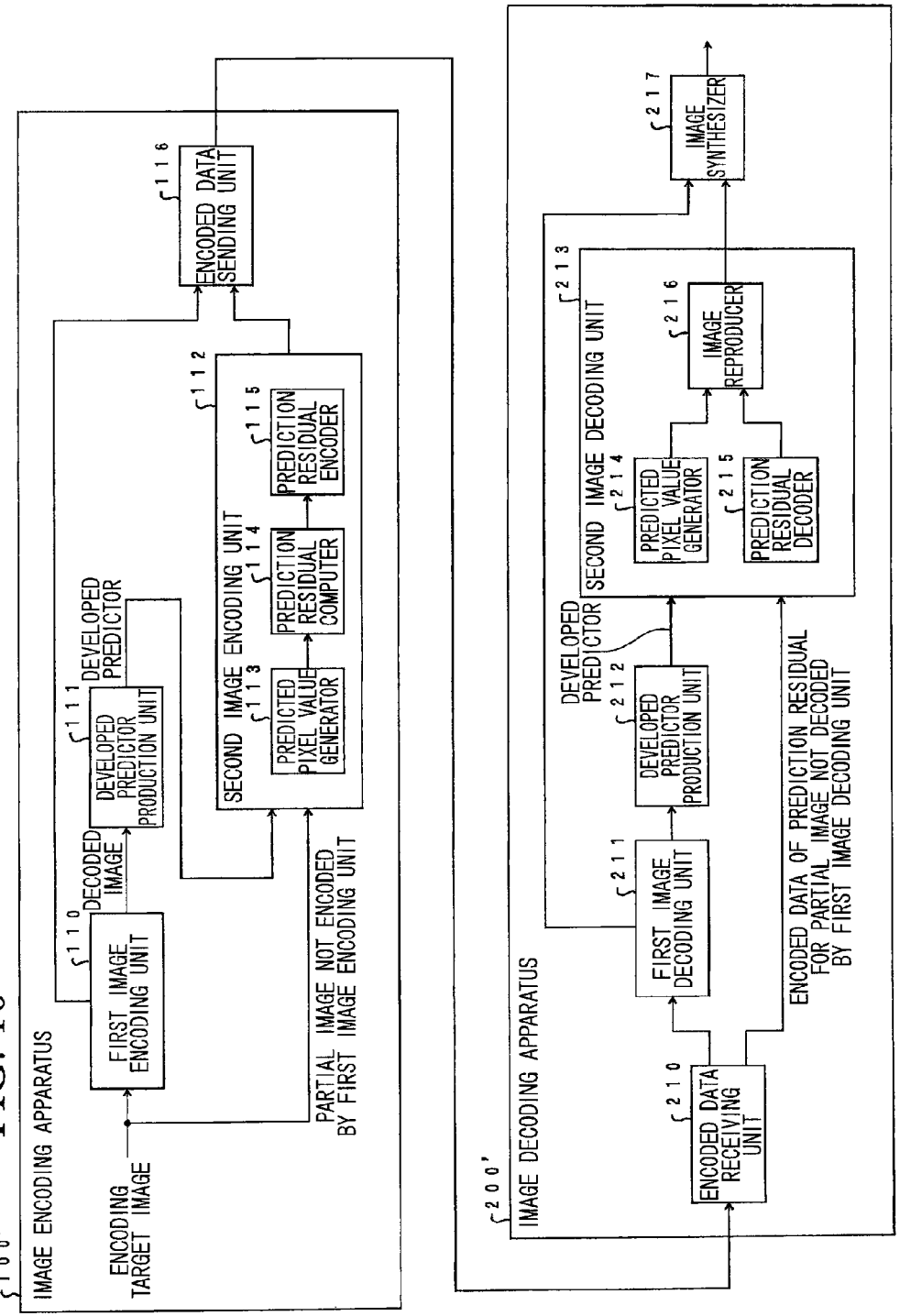
FIG. 10 is a diagram showing the structures of an image encoding apparatus and an image decoding apparatus as another embodiment of the present invention.

FIG. 10 shows other embodiments of the image encoding apparatus 100 and the image decoding apparatus 200 which use the above-described developed predictor producing apparatus 1.

The image encoding apparatus 100 and the image decoding apparatus 200 shown in FIG. 7 require encoding and transmission of a developed predictor. However, an image encoding apparatus 100' and an image decoding apparatus 200' shown in FIG. 10 do not perform such encoding and transmission of a developed predictor, and the developed predictor produced by the encoding side can be produced by the decoding side by using previously-transmitted pixels, so that the encoding and decoding sides can encode and decode an image by using the same developed predictor.

In order to implement the above function, the image encoding apparatus 100' shown in FIG. 10 has a first image encoding unit 110 for encoding a partial image, which belongs to an encoding target image and has a predetermined size, by using an existing predictor; a developed predictor production unit 111 for producing a developed predictor applied to a decoded image of the encoded partial image, where the decoded image was obtained by decoding executed by the first image encoding unit 110 so as to perform the relevant encoding; a second encoding unit 112 for encoding the remaining partial image of the encoding target image by using the developed predictor produced by the developed predictor production unit 111; and an encoded data sending unit 116 which sends encoded data generated by the first encoding unit 110 and the second encoding unit 112 to the image decoding apparatus 200'.

In order to encode a partial image which is not encoded by the first encoding unit 110, the above second encoding unit 112 includes a predicted pixel value generator 113 which predicts a pixel value by using the developed predictor produced by the developed predictor production unit 111, a prediction residual computer 114 which computes a prediction residual based on the pixel value predicted by the predicted pixel value generator 113, and a prediction residual encoder 115 for encoding the prediction residual computed by the prediction residual computer 114.

The image decoding apparatus 200' shown in FIG. 10 has an encoded data receiving unit 210 for receiving the encoded data sent from the image encoding apparatus 100'; a first image decoding unit 211 for decoding the encoded data which was generated by the first image encoding unit 110 and is contained in the encoded data received by the encoded data receiving unit 210; a developed predictor production unit 212 for producing a developed predictor applied to the partial image decoded by the first image decoding unit 211; a second image decoding unit 213 for decoding a partial image which is not decoded by the first image decoding unit 211, based on the developed predictor produced by the developed predictor production unit 212 and the encoded data which was generated by the second encoding unit 112 and is contained in the encoded data received by the encoded data receiving unit 210; and an image synthesizer 217 for generating the image as the decoding target by synthesizing the image decoded by the first image decoding unit 211 and the image decoded by the second image decoding unit 213.

In order to decode a partial image which is not decoded by the first image decoding unit 211, the above second image decoding unit 213 includes an predicted pixel value generator 214 for predicting a predicted value by using the developed predictor produced by the developed predictor production unit 212; a prediction residual decoder 215 for decoding the encoded data of the prediction residual which was received by the encoded data receiving unit 210 and is assigned to the partial image that is not decoded by the first image decoding unit 211; and an image reproducer 216 for reproducing the partial image that is not decoded by the first image decoding unit 211, based on the pixel value predicted by the predicted pixel value generator 214 and the prediction residual decoded by the prediction residual decoder 215.

Figure 11:
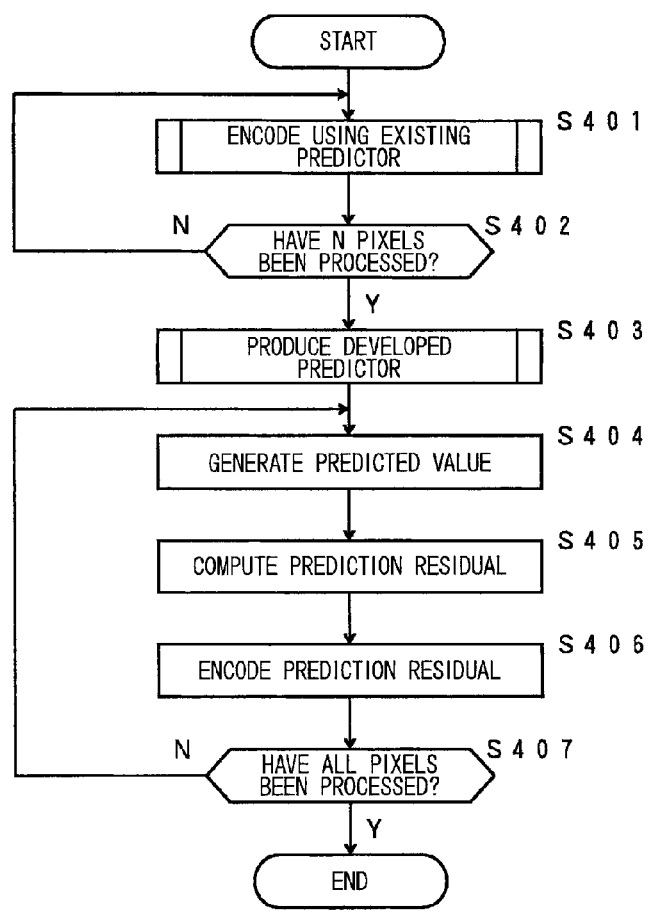
FIG. 11 is a flowchart executed by the image encoding apparatus in the embodiment.
Figure 12:
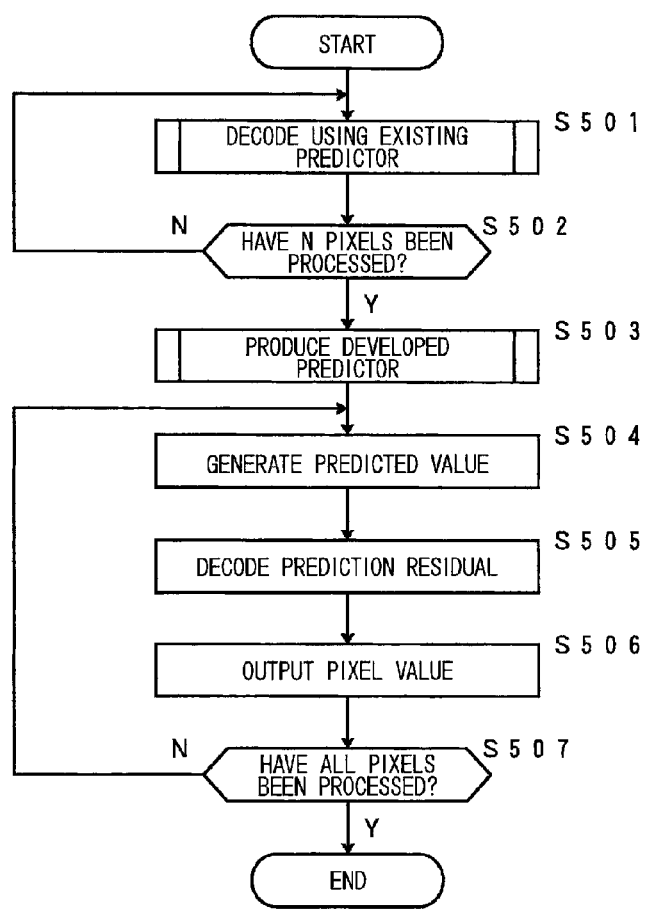
FIG. 12 is a flowchart executed by the image decoding apparatus in the embodiment.

FIG. 11 is a flowchart executed by the image encoding apparatus 100' shown in FIG. 10, and FIG. 12 is a flowchart executed by the image decoding apparatus 200' shown in FIG. 10.

In accordance with the flowcharts, operations performed by the image encoding apparatus 100' and the image decoding apparatus 200' will be explained.

When the image encoding apparatus 100' receives a request for encoding an encoding an image, it first starts encoding of a partial image (having N pixels as an assumed condition) which belongs to an encoding target image and has a predetermined size, by using an existing predictor (see step S401). In the next step S402, the encoding is continued until the completion of the encoding for the relevant partial image is confirmed, thereby encoding the partial image.

For example, such a partial image which belongs to an encoding target image and which has a predetermined size is encoded using JPEG-LS.

In the next step S403, a developed predictor applied to a decoded image (for the encoded partial image) obtained by the encoding in the above step S401 is produced based on the operation executed by the above-described developed predictor producing apparatus 1.

As described above, basically, a developed predictor having a preferable estimated value is produced in accordance with an estimated value defined as the sum of information content X for representing a tree structure and information content Y for a prediction residual of the whole image for which pixel value prediction was actually performed using a prediction procedure based on the relevant tree structure. However, since it is unnecessary to transmit a developed predictor in the present embodiment, the estimated value is computed by defining the information content X to be 0 (the development procedure is not changed), and the developed predictor is produced based on the computed estimated value.

Next, for the encoding of the remaining partial image which also belongs to the encoding target image but was not encoded in the above step S401, a predicted pixel value (the above-described p') is generated using the produced developed predictor (see step S404), and in the next step S405, a prediction residual (the above-described p−p') is computed based on the generated predicted pixel value.

In the next step S406, the computed prediction residual is encoded, and in the following step S407, it is determined whether or not the encoding has been completed for all pixels contained in the encoding target image. If it is determined that the encoding of all pixels has not yet been completed, the operation returns to step S404. If it is determined that the encoding of all pixels has been completed, the current operation is terminated.

As shown in the flowchart of FIG. 12, when the image decoding apparatus 200' receives the encoded data generated by the image encoding apparatus 100', the image decoding apparatus 200' first starts decoding of the encoded data of the partial image (having N pixels as the assumed condition) encoded by the image encoding apparatus 100' by using the existing predictor (see step S501). In the next step S502, the decoding is continued until the completion of the decoding for the relevant partial image is confirmed, thereby decoding the partial image.

For example, such a partial image having a predetermined size is decoded using JPEG-LS.

In the next step S503, a developed predictor applied to a decoded image obtained by the decoding in the above step S501 is produced based on the operation executed by the above-described developed predictor producing apparatus 1.

As described above, basically, a developed predictor having a preferable estimated value is produced in accordance with an estimated value defined as the sum of information content X for representing a tree structure and information content Y for a prediction residual of the whole image for which pixel value prediction was actually performed using a prediction procedure based on the relevant tree structure. However, since it is unnecessary to transmit a developed predictor in the present embodiment, the estimated value is computed by defining the information content X to be 0 (the development procedure is not changed), and the developed predictor is produced based on the computed estimated value.

Next, for the decoding of the remaining partial image which also belongs to the decoding target image, a predicted pixel value (the above-described p') is generated using the produced developed predictor (see step S504), and in the next step S505, a prediction residual (the above-described p−p') is decoded by decoding the encoded data of the prediction residual.

In the next step S506, a pixel value is generated and output based on the above-generated predicted pixel value and the decoded prediction residual.

In the next step S507, it is determined whether or not the relevant decoding has been completed for all pixels included in the remaining partial image of the decoding target image. If it is determined that the decoding of all pixels has not yet been completed, the operation returns to step S504. If it is determined that the decoding of all pixels has been completed, the current operation is terminated.

As described above, the image encoding apparatus 100' having the structure shown in FIG. 10 encodes a part of the encoding target image using an existing encoding method, produces a developed predictor by using a decoded image obtained by that encoding, and encodes the remaining partial image by using the produced developed predictor.

The image decoding apparatus 200' having the structure shown in FIG. 10 decodes a part of the decoding target image by decoding the relevant encoded data in accordance with an existing decoding method, produces a developed predictor by using the decoded image, and decodes the remaining partial image by using the produced developed predictor.

Also as described above, the developed predictor producing apparatus 1 automatically produces a developed predictor which implements highly accurate pixel value prediction.

Therefore, in accordance with the image encoding apparatus 100' and the image decoding apparatus 200' which encode and decode an image by using a developed predictor produced by the developed predictor producing apparatus 1, a high level of encoding efficiency can be acquired.

In an experiment performed by the inventors of the above-described present invention so as to verify effectiveness of the invention, when an estimated value X+Y was minimized for an image, the following relatively simple developed predictor could be produced.

(add (sub 0.5 (sub (div (Igap) (Ine)) (Igap))) (div (Inw) (Igap)))

where Igap indicates a non-linear predicted value obtained from the periphery, and Ine and Inw are peripheral pixel values shown in FIG. 14.

The acquired estimated value X+Y was 1170235 bits, which indicated that it was better than the maximum value 1176090 bits obtainable by currently available existing predictors.

The relevant developed predictor performs a division between predicted values, which indicates that the present invention may produce a predictor which cannot be anticipated in consideration of conventional predictors.

Below, results of the experiment performed for verifying effectiveness of the invention will be shown. In the experiment, an existing predicted value generation function (as an individual) was not included in a parent population.

In the present experiment, comparative prediction trees were a least-square predictor (LS) which performs linear prediction, a minimum entropy predictor (LE) which also performs linear prediction, a GAP predictor for CALIC, which performs non-linear prediction (using four peripheral pixels, similar to the present invention (see FIG. 14)), and an MED predictor for JPEG-LS, which also performs non-linear prediction (using three peripheral pixels).

In the above "LE" prediction, five coefficients in LS prediction are used as initial values, and Y is minimized by means of multidimensional search based on a Powell method. The LE prediction provides a highest level of efficiency among linear prediction methods.

FIG. 13 shows the information content (X+Y) for the residual of each image (having 512×512 pixels, 8-bit gradation, and only luminance data) used in the experiment, where the information content also considers overhead (50 for LS and LE, 0 for MED, and the X bits for the method proposed by the present invention). FIG. 13 also shows each increment from the information content of the present proposed method for each image. In addition, the bottom line in FIG. 13 shows the information content X of a tree of the present invention for each image. The unit for the residual information content is bpp (pit per pixel).

Referring to the results of the experiment, it was confirmed that the predictor automatically produced in accordance with the present invention had the highest level of efficiency. The average of the information content X for a tree of the predictor automatically produced in accordance with the present invention is 726 bits, which indicates slight complexity in comparison with GAP and MED predictors (which respectively have 349.5 bits and 116.0 bits, and were defined to be zero in the present experiment).

For image "Lena", a development computation was separately performed without consideration of the tree information content X, so as to minimize only the residual information content Y. In comparison with the results shown in FIG. 13, the results of the separate computation for the proposed method of the present invention show that Y (Y itself is not shown in FIG. 14) decreased by 0.06%, but X increased approximately three times (i.e., X=2795 bits), so that X+Y increased by 0.14%. Although enlargement of a tree is a problem called "bloat" due to GP, it can be naturally prevented by the present invention which also considers X.

For image "Baboon", a prediction tree for assigning different processes to a lower ⅙ region and the remaining region in the image was produced. The ⅙ and the remaining regions correspond to whether or not it is a region only having a beard. Such a prediction tree supports a high-level search based on GP.

The effectiveness of the present invention could be verified based on the above-described results of the experiments.

INDUSTRIAL APPLICABILITY

As described above, the present invention can be applied to encoding and decoding of a video or static image, so as to implement highly accurate pixel value prediction. Therefore, a prediction procedure which is suitable for each input image and can further reduce the relevant amount of code can be automatically produced using a computer.

REFERENCE SYMBOLS

1 developed predictor producing apparatus
10 parent population generation unit
11 parent population storage unit
12 parent individual selection and replication unit
13 child individual generation unit
14 mutation information storage unit
15 estimated value computation unit
16 surviving individual determination unit
17 convergence determination unit
18 developed predictor determination unit

The invention claimed is:

1. A method for automatically producing a predictor for use in image encoding, the predictor generating a value of an encoding target pixel by using a previously-decoded pixel, the method comprising:
   a first step that generates a parent population by randomly producing predictors each being represented by a tree structure, where said predictors include a predicted value generation function that outputs a predicted value by a prediction encoding method;
   a second step that selects a predetermined number of predictors as parents from the parent population, and produces one or more predictors as children by processing said predictors using a genetic programming;
   a third step that:
      selects a predictor having a minimum estimation cost from among the predictors selected and generated in the second step, where the sum of an information content for representing the tree structure and an information content of a prediction residual of the whole image obtained by pixel value prediction using a prediction procedure for the tree structure is used as an estimation cost, and the selected predictor has the best estimation cost for encoding an encoding target image; and
      stores the selected predictor and one or more other predictors into the parent population; and
   a fourth step that performs a control to iterate the second and third steps until a predetermined condition is satisfied, and determines a predictor having a best estimation cost as the result of the iteration to be a final predictor, wherein in the tree structure, said predicted value generation function, whose arguments are predetermined, and a function which outputs coordinates of a pixel within an image without using arguments, are each a candidate of an end node of the tree.

2. The method in accordance with claim 1, wherein:
in the first step, the parent population is generated so that an existing predictor is included in the parent population.

3. An image encoding method of encoding an image using a predicted pixel value generated by a predetermined predictor that predicts a value of an encoding target pixel by using a previously-decoded pixel, the method comprising:
  a first step that produces a predictor having a best estimation cost for encoding an encoding target image, by means of the method for automatically producing a predictor in accordance with claim 1;
  a second step that encodes the predictor produced by the first step;
  a third step that generates a predicted value of each pixel included in the encoding target image based on the predictor produced by the first step; and
  a fourth step that encodes a prediction residual signal computed based on the predicted pixel value generated by the third step.

4. An image decoding method of decoding encoded data of an image which was encoded using a predicted pixel value generated by a predetermined predictor that predicts a value of an encoding target pixel by using a previously-decoded pixel, the method comprising:
  a first step that decodes encoded data for a predictor produced by the method for automatically producing a predictor in accordance with claim 1, where the encoded data was generated on an encoding side by randomly producing predictors each being represented by the tree structure, where said predictors include a predicted value generation function that outputs a predicted value by a prediction method;
  a second step that generates a predicted value of each pixel included in a decoding target image based on the predictor decoded by the first step;
  a third step that decodes encoded data for a prediction residual signal computed using the predicted pixel value which was generated based on the predictor decoded by the first step, where the encoded data was generated on an encoding side; and
  a fourth step that reproduces the decoding target image based on the predicted pixel value generated by the second step and the prediction residual signal decoded by the third step.

5. An image encoding method of encoding an image using a predicted pixel value generated by a predetermined predictor that predicts a value of an encoding target pixel by using a previously-decoded pixel, the method comprising:
  a first step that encodes a partial encoding target image having a predetermined size, by using an existing predictor produced not based on a tree structure developing method;
  a second step that produces a predictor having a best estimation cost for encoding a decoded image obtained during the encoding of the partial encoding target image by the first step, by means of the method for automatically producing a predictor in accordance with claim 1, which estimates an information content for representing a tree structure to be zero;
  a third step that generates a predicted value of each pixel included in a part other than the partial encoding target image in the encoding target image, based on the predictor produced by the second step; and
  a fourth step that encodes a prediction residual signal computed based on the predicted pixel value generated by the third step.

6. An image decoding method of decoding encoded data of an image which was encoded using a predicted pixel value generated by a predetermined predictor that predicts a value of an encoding target pixel by using a previously-decoded pixel, the method comprising:
  a first step that decodes encoded data for a partial decoding target image which has a predetermined size and was encoded using an existing predictor produced not based on a tree structure developing method, where the encoded data was generated on an encoding side;
  a second step that produces a predictor having a best estimation cost for encoding the partial decoding target image obtained by the first step, by means of the method for automatically producing a predictor in accordance with claim 1, which estimates an information content for representing a tree structure to be zero;
  a third step that generates a predicted value of each pixel included in a remaining part other than the partial decoding target image in said image, based on the predictor produced by the second step;
  a fourth step that decodes encoded data for a prediction residual signal computed using the predicted pixel value which was generated based on the predictor decoded by the second step, where the encoded data was generated on an encoding side; and
  a fifth step that reproduces the remaining part, based on the predicted pixel value generated by the third step and the prediction residual signal decoded by the fourth step.

7. An apparatus for automatically producing a predictor for use in image encoding, the predictor generating a value of an encoding target pixel by using a previously-decoded pixel, the apparatus comprising:
  a first device that generates a parent population by randomly producing predictors each being represented by a tree structure, where said predictors include a predicted value generation function that outputs a predicted value by a prediction encoding method by randomly producing predictors each being represented by the tree structure, where said predictors include a predicted value generation function that outputs a predicted value by a prediction method;
  a second device that selects a predetermined number of predictors as parents from the parent population, and produces one or more predictors as children by processing said predictors using a genetic programming;
  a third device that:
  selects a predictor having a minimum estimation cost from among the predictor selected and generated by the second device, where the sum of an information content for representing the tree structure and an information content of a prediction residual of the whole image obtained by pixel value prediction using a prediction procedure for the tree structure is used as an estimation cost, and the selected predictor has the best estimation cost for encoding an encoding target image; and
  stores the selected predictor and one or more other predictors into the parent population; and
  a fourth device that performs a control to iterate processes performed by the second and third devices until a predetermined condition is satisfied, and determines a predictor having a best estimation cost as the result of the iteration to be a final predictor, wherein in the tree structure, said predicted value generation function, whose arguments are predetermined, and a function which outputs coordinates of a pixel within an image without using arguments are each a candidate of an end node of a tree.

8. The apparatus in accordance with claim 7, wherein:
the first device generates the parent population so that an existing predictor is included in the parent population.

9. An image encoding apparatus of encoding an image using a predicted pixel value generated by a predetermined predictor that predicts a value of an encoding target pixel by using a previously-decoded pixel, the apparatus comprising:
   a first device that produces a predictor having a best estimation cost for encoding an encoding target image, by means of the apparatus of claim 7;
   a second device that encodes the predictor produced by the first device;
   a third device that generates a predicted value of each pixel included in the encoding target image based on the predictor produced by the first device; and
   a fourth device that encodes a prediction residual signal computed based on the predicted pixel value generated by the third device.

10. An image decoding apparatus of decoding encoded data of an image which was encoded using a predicted pixel value generated by a predetermined predictor that predicts a value of an encoding target pixel by using a previously-decoded pixel, the apparatus comprising:
   a first device that decodes encoded data for a predictor produced by the apparatus of claim 7, where the encoded data was generated on an encoding side;
   a second device that generates a predicted value of each pixel included in a decoding target image based on the predictor decoded by the first device;
   a third device that decodes encoded data for a prediction residual signal computed using the predicted pixel value which was generated based on the predictor decoded by the first device, where the encoded data was generated on an encoding side; and
   a fourth device that reproduces the decoding target image based on the predicted pixel value generated by the second device and the prediction residual signal decoded by the third device.

11. An image encoding apparatus of encoding an image using a predicted pixel value generated by a predetermined predictor that predicts a value of an encoding target pixel by using a previously-decoded pixel, the apparatus comprising:
   a first device that encodes a partial encoding target image having a predetermined size, by using an existing predictor produced not based on a tree structure developing method;
   a second device that produces a predictor having a best estimation cost for encoding a decoded image obtained during the encoding of the partial encoding target image by the first device, by means of the apparatus of claim 7, which estimates an information content for representing a tree structure to be zero;
   a third device that generates a predicted value of each pixel included in a part other than the partial encoding target image in the encoding target image, based on the predictor produced by the second device; and
   a fourth device that encodes a prediction residual signal computed based on the predicted pixel value generated by the third device.

12. An image decoding apparatus of decoding encoded data of an image which was encoded using a predicted pixel value generated by a predetermined predictor that predicts a value of an encoding target pixel by using a previously-decoded pixel, the apparatus comprising:
   a first device that decodes encoded data for a partial decoding target image which has a predetermined size and was encoded using an existing predictor produced not based on a tree structure developing method, where the encoded data was generated on an encoding side;
   a second device that produces a predictor having a best estimation cost for encoding the partial decoding target image obtained by the first device, by means of the apparatus of claim 7, which estimates an information content for representing a tree structure to be zero;
   a third device that generates a predicted value of each pixel included in a remaining part other than the partial decoding target image in said image, based on the predictor produced by the second device;
   a fourth device that decodes encoded data for a prediction residual signal computed using the predicted pixel value which was generated based on the predictor decoded by the second device, where the encoded data was generated on an encoding side; and
   a fifth device that reproduces the remaining part, based on the predicted pixel value generated by the third device and the prediction residual signal decoded by the fourth device.

13. A non-transitory computer-readable storage medium which stores a program for automatically producing a predictor by which a computer executes the method in accordance with claim 1.

14. A non-transitory computer-readable storage medium which stores an image encoding program by which a computer executes the image encoding method in accordance with claim 3 or 5.

15. A non-transitory computer-readable storage medium which stores an image decoding program by which a computer executes the image decoding method in accordance with claim 4 or 6.

* * * * *